(12) United States Patent
Adegawa

(10) Patent No.: US 7,157,205 B2
(45) Date of Patent: Jan. 2, 2007

(54) INTERMEDIATE LAYER COMPOSITION FOR MULTILAYER RESIST PROCESS, PATTERN-FORMING PROCESS USING THE SAME, AND LAMINATE

(75) Inventor: Yutaka Adegawa, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/883,831

(22) Filed: Jul. 6, 2004

(65) Prior Publication Data

US 2005/0003299 A1    Jan. 6, 2005

(30) Foreign Application Priority Data

Jul. 4, 2003    (JP)    ............ P.2003-271065

(51) Int. Cl.
*G03F 7/004*    (2006.01)

(52) U.S. Cl. ............ 430/270.1; 430/311; 430/905; 522/148; 522/172; 522/861

(58) Field of Classification Search ............ 430/270.1, 430/905, 311; 522/148, 172, 861
See application file for complete search history.

(56) References Cited

U.S. PATENT DOCUMENTS 6,897,004 B1 *    5/2005    Uenishi et al. .......... 430/270.1

FOREIGN PATENT DOCUMENTS

| JP | B 4-43264 B2 | 7/1992 |
|----|----|----|
| JP | B 4-44741 B2 | 7/1992 |
| JP | B 6-38400 B2 | 5/1994 |
| JP | 2573371 B2 | 10/1996 |
| JP | 2641644 B2 | 5/1997 |
| JP | 2901044 B2 | 3/1999 |

* cited by examiner

*Primary Examiner*—Amanda Walke
(74) *Attorney, Agent, or Firm*—Sughrue Mion, PLLC

(57) ABSTRACT

An intermediate layer composition having a silicon-containing polymer(A) having a specific structure and a pattern-forming process using the same.

10 Claims, No Drawings

INTERMEDIATE LAYER COMPOSITION FOR MULTILAYER RESIST PROCESS, PATTERN-FORMING PROCESS USING THE SAME, AND LAMINATE

BACKGROUND OF THE INVENTION

1. Field of the Invention

The present invention relates to a lithographic technology capable of forming highly precise micro pattern on a substrate in the manufacture of semiconductor integrated circuits, in particular the present invention relates to an intermediate layer composition for multilayer resist process, a pattern-forming method using the same, and laminate.

2. Description of the Related Art

With the rapid progress in the integration degree of semiconductor integrated circuits, requirements for fining of resist pattern and heightening accuracy in lithographic process have increased more and more. To cope with these requirements, technical development for shorter wavelengths of light sources is surely progressing in exposing methods from conventional near ultraviolet rays such as g-rays and i-rays to KrF, ArF and excimer laser beams such as $F_2$, EUV rays and X-rays for higher resolution.

On the other hand, the reduction of accuracy of a resist patterns by the variation in resist film thickness due to the difference in levels of a substrate generated in the manufacture of semiconductor integrated circuits has become an issue. As a result of investigation of uneven substrates, this problem is coming to the easing by the development of CMP technique of flattening. A further serious problem different from this arises. With the tendency of exposure light sources of becoming shorter wavelengths, light absorption of resist materials becomes more and more, so that conventional aromatic ring-based organic polymer materials cannot be used. Further, thinning of resist films is required for the reduction of light absorption and widening of lithographic process window, accordingly sufficient dry etching resistance can be ensured no longer by the conventional monolayer resist process, and there is little likelihood of highly precise process of substrates being effected.

As means for solving these problems, a multilayer resist system, in particular, a three-layer resist process is attracting public attention.

The three-layer resist process includes the following processes:
(a) forming a lower resist layer comprising an organic material on a substrate,
(b) laminating on the lower resist layer an intermediate layer and an upper resist layer comprising an organic material crosslinkable or decomposable upon irradiation with radiation, and
(c) forming a prescribed pattern on the upper resist layer, and then etching the intermediate layer, the lower layer and the substrate successively.

As the intermediate layer used here, organopolysiloxane (a silicone resin) and an $SiO_2$ coating solution (SOG) are so far been known.

An intermediate layer is a layer having a function of transferring the pattern of an upper layer to a lower layer by etching process and is provided between an upper layer resist and a lower layer resist. Thus, a lower layer pattern having a high aspect ratio transferred to the lower layer mainly by dry etching with the intermediate layer as the mask can be obtained With respect to intermediate layers, various materials are reported, e.g., improved organopolysiloxane materials are disclosed in JP-B-4-43264 (the term "JP-B" as used herein means an "examined Japanese patent publication"), intermediate layers using silicone compounds, e.g., $Si(OH)_4$, are disclosed in JP-B-6-38400, the materials of intermediate layers comprising silylated products of clay minerals are disclosed in Japanese Patent 2573371, the materials of intermediate layers comprising the mixtures of halogenosilane or organohalogenosilane and ammonia or amines are disclosed in Japanese Patent 2641644, the materials of intermediate layers comprising polysiloxane derivatives are disclosed in Japanese Patent 2901044, and the materials of intermediate layers comprising organopolysilsesquioxane are disclosed in JP-B-4-44741.

However, these intermediate layers are substantially inferior in preservation stability, and have critical defects, e.g., the upper layer resist pattern formed on an intermediate layer becomes a trapezoidal form and deteriorates line roughness edge (LER) in etching the intermediate layer with the upper layer resist pattern as the mask. In addition, they have a defect of bringing about pattern peeling of the upper layer. Moreover, the etching rate of intermediate layers is not sufficient.

SUMMARY OF THE INVENTION

The objects of the present invention are to solve these related art problems and to provide an intermediate layer composition for multilayer resist process and a pattern-forming process. Specifically, the object of the present invention is to provide an intermediate layer composition for multilayer resist process soluble in an organic solvent, excellent in preservation stability, not forming a trapezoidal form in patterning, excellent in line edge roughness, peeling resistance of an upper layer resist pattern, and improved in etching rate. Another object of the invention is to provide a pattern-forming process.

The present invention has been attained as a result of eager investigation of the present inventors regarding the above characteristics. That is, the objects of the present invention can be achieved by the following constitution.

(1) An intermediate layer composition for multilayer resist process containing polymer (A) having a repeating unit represented by the following formula (I):

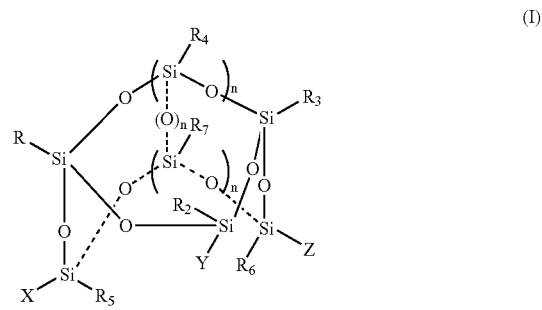

wherein $R_1$ to $R_7$ are the same or different, and each represents a hydrogen atom, an alkyl group, an alkoxyl group, an aryl group, an aralkyl group, a cycloalkyl group or an alkenyl group; one of X, Y and Z represents a hydroxyl group, and the another one of X, Y and Z is —O—, and the other one of X, Y and Z is a group represented by following formula (IA) which is linked on the oxygen atom side; and n represents from 0 to 10;

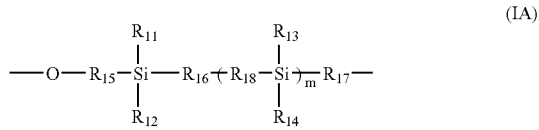

(IA)

wherein $R_{11}$ to $R_{14}$ are the same or different, and each represents a hydrogen atom, an alkyl group, an alkoxyl group, an aryl group, an aralkyl group, a cycloalkyl group or an alkenyl group;

$R_{15}$ to $R_{17}$ are the same or different, and each represents a single bond or an alkylene group;

$R_{18}$ represents a single bond or —O—; and m represents from 0 to 10.

(2) A multilayer resist pattern-forming process comprising:

(a) a process of forming a lower resist layer comprising an organic material on a substrate, (b) a process of laminating on the lower resist layer an intermediate layer and an upper resist layer comprising an organic material crosslinkable or decomposable upon irradiation with radiation, and (c) a multilayer resist process containing processes of forming a prescribed pattern on the upper resist layer, and then etching the intermediate layer, the lower layer and the substrate successively, wherein the intermediate layer composition as described in the above item (1) is used in the intermediate layer.

As preferred embodiments, the following constitutions are exemplified.

(3) The intermediate layer composition as described in the above item (1) further contains (B) a radical generator.

(4) The intermediate layer composition as described in the above item (1) or (3) further contains (C) a crosslinking agent.

(5) The intermediate layer composition as described in any of the above items (1), (3) and (4) further contains (D) a compound capable of generating an acid by heating.

(6) The intermediate layer composition as described in any of the above items (1), (3), (4) and (5) further contains (E) a radical polymerizable compound.

(7) The intermediate layer composition as described in any of the above items (1), (3) to (6) further contains (F) an organic solvent.

(8) The intermediate layer composition as described in any of the above items (1), (3) to (7) further contains (G) a surfactant.

(9) The multilayer resist pattern-forming process as described in the above item (2), wherein the intermediate layer composition as described in any of the above items (3) to (8) is used in the intermediate layer.

(10) The multilayer resist pattern-forming process as described in the above item (2) or (9), wherein after coating the intermediate layer composition on the lower resist, the intermediate layer is insolubilized in an organic solvent by being baked at high temperature.

(11) A laminate comprising: a substrate, a lower resist layer comprising an organic material, an intermediate layer and an upper resist layer comprising an organic material crosslinkable or decomposable upon irradiation with radiation, in this order, wherein the intermediate layer comprises polymer (A) having a repeating unit represented by the following formula (I):

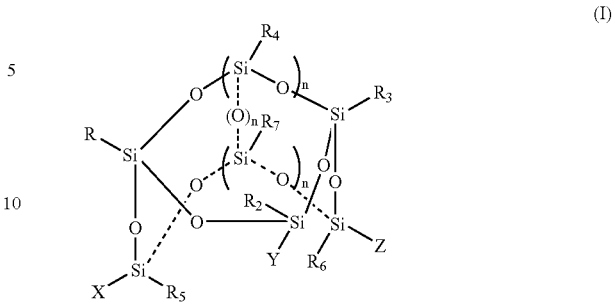

wherein $R_1$ to $R_7$ are the same or different, and each represents a hydrogen atom, an alkyl group, an alkoxyl group, an aryl group, an aralkyl group, a cycloalkyl group or an alkenyl group; one of X, Y and Z represents a hydroxyl group, and the another one of X, Y and Z is —O—, and the other one of X, Y and Z is a group represented by following formula (IA) which is linked on the oxygen atom side; and n represents from 0 to 10;

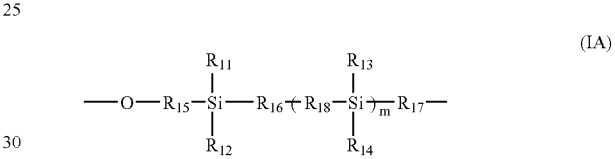

wherein $R_{11}$ to $R_{14}$ are the same or different, and each represents a hydrogen atom, an alkyl group, an alkoxyl group, an aryl group, an aralkyl group, a cycloalkyl group or an alkenyl group; $R_{15}$ to $R_{17}$ are the same or different, and each represents a single bond or an alkylene group; $R_{18}$ represents a single bond or —O—; and m represents from 0 to 10.

DETAILED DESCRIPTION OF THE INVENTION

The best mode for carrying out the invention is described below, but the present invention is not limited thereto.

(1) Component (A) For Use in the Intermediate Layer Composition of the Invention:

The intermediate layer composition of the invention contains polymer (A) having a repeating unit represented by formula (I).

In formula (I), $R_1$ to $R_7$, which maybe the same or different, each represents a hydrogen atom, an alkyl group, an alkoxyl group, an aryl group, an aralkyl group, a cycloalkyl group or an alkenyl group; one of X, Y and Z represents a hydroxyl group, and the other two, which are different from each other, are selected from —O— and formula (IA); and n represents from 0 to 10. In formula (IA), $R_{11}$ to $R_{14}$, which may be the same or different, each represents a hydrogen atom, an alkyl group, an alkoxyl group, an aryl group, an aralkyl group, a cycloalkyl group or an alkenyl group; $R_{15}$ to $R_{17}$, which may be the same or different, each represents a single bond or an alkylene group; $R_{18}$ represents a single bond or —O—; and m represents from 0 to 10.

The alkyl group represented by $R_1$ to $R_7$ and $R_{11}$ to $R_{14}$ is preferably a straight chain or branched alkyl group having from 1 to 20 carbon atoms, e.g., a methyl group, an ethyl group, a propyl group, a butyl group, a pentyl group, a hexyl group, an octyl group, a nonyl group, a dodecyl group, a hexadecyl group or an octadecyl group.

The alkoxyl group represented by $R_1$ to $R_7$ and $R_{11}$ to $R_{14}$ is preferably a straight chain or branched alkoxyl group having from 1 to 20 carbon atoms, e.g., a methoxy group, an ethoxy group, a propoxy group, a butoxy group, a hentyloxy group, a hexyloxy group, an octyloxy group, a nonyloxy group, or a hexadecyloxy group.

The cycloalkyl group represented by $R_1$ to $R_7$ and $R_{11}$ to $R_{14}$ is preferably a cycloalkyl group having from 3 to 20 carbon atoms, e.g., a cyclopropyl group, a cyclobutyl group, a cyclopentyl group, a cyclohexyl group or an adamantyl group, and more preferably a cyclopentyl group or a cyclohexyl group.

The alkenyl group represented by $R_1$ to $R_7$ and $R_{11}$ to $R_{14}$ is preferably an alkenyl group having from 2 to 20 carbon atoms, e.g., avinyl group, apropenyl group, an allyl group or abutenyl group, and more preferably a vinyl group.

The alkyl group, alkoxyl group, cycloalkyl group and alkenyl group represented by $R_1$ to $R_7$ and $R_{11}$ to $R_{14}$ may further be substituted with a halogen atom, a nitryl group, an amino group or a nitro group.

The aryl group represented by $R_1$ to $R_7$ and $R_{11}$ to $R_{14}$ is preferably an aryl group having from 6 to 20 carbon atoms, e.g., a phenyl group, a tolyl group, a xylyl group, a biphenyl group, a naphthyl group, an anthryl group or a phenanthryl group.

The aralkyl group represented by $R_1$ to $R_7$ and $R_{11}$ to $R_{14}$ is preferably an aralkyl group having from 7 to 20 carbon atoms, e.g., a benzyl group, a phenylethyl group, a methylbenzyl group or a naphthylmethyl group.

The aryl group and aralkyl group represented by $R_1$ to $R_7$ and $R_{11}$ to $R_{14}$ may further be substituted with an alkyl group, an alkoxyl group, a hydroxyl group, a halogen atom, a nitryl group, an amino group or a nitro group.

$R_1$ to $R_7$ and $R_{11}$ to $R_{14}$ preferably have 20 or less carbon atoms including a substituent respectively.

The alkylene group represented by $R_{15}$ to $R_{17}$ is preferably a straight chain or branched alkylene group having from 1 to 10 carbon atoms, e.g., a methylene group, an ethylene group, a propylene group, a butylene group, an amylene group, a hexylene group, a heptylene group, an octylene group, a nonylene group or a polymethylene group [—($CH_{2n}$)—, n is 3 or more].

The alkylene group represented by $R_{15}$ to $R_{17}$ may further be substituted with a hydroxyl group, a halogen atom, a nitryl group, an amino group or a nitro group.

In formula (I), it is preferred that $R_1$ to $R_7$ represent an ethynyl group and a phenyl group, and the number of both groups be from 1:6 to 6:1, and $R_1$ to $R_7$ represent a biphenyl group and a phenyl group, and the number of both groups be from 1:6 to 6:1.

The weight average molecular weight of the polymers of component (A) for use in the invention is not particularly restricted, but preferably from 1,000 to 1,000,000, more preferably from 2,000 to 100,000, in view of the compatibility with components (B), (C) and/or component (E), and the film-forming property.

The polymers of component (A) for use in the invention may be used alone or two or more polymers may be used as mixture. The amount of the polymers of component (A) is from 40 to 99 mass %, preferably from 60 to 98 mass %, based on the total mass of the intermediate layer composition (exclusive of solvents)

In the present invention, the content of Si can be increased, since no side reaction occurs even when a large amount of the polymers of component (A) are contained in an intermediate layer composition, so that the etching rate of the intermediate layer can be improved.

The content of polymer (A) having a repeating unit represented by formula (I) in an intermediate layer composition is from 20 to 50 mass %, preferably from 25 to 45 mass %, based on the total solid contents in the intermediate layer composition.

Polymer (A) having a repeating unit represented by formula (I) can be synthesized according to the methods described, e.g., in *J. Am. Chem. Soc.*, 1964, 86, 1120, *J. Am. Chem. Soc.*, 1965, 87, 4313, *ACS Polym. Mat. Sci. & Eng. Preprints*, 1998, 79, 389, *J. Am. Chem. Soc.*, 1990, 112, 1931–1936, and *J. Am. Chem. Soc.*, 1989, 111, 1741–1748.

An example of synthesis is shown below.

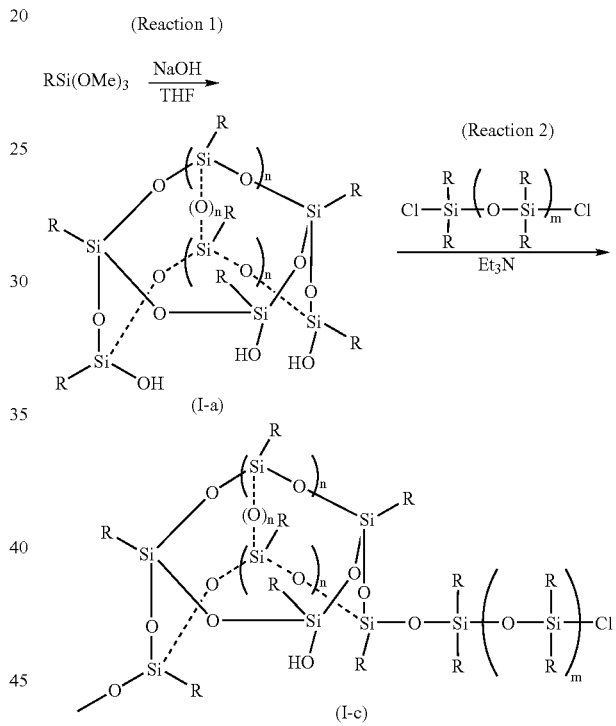

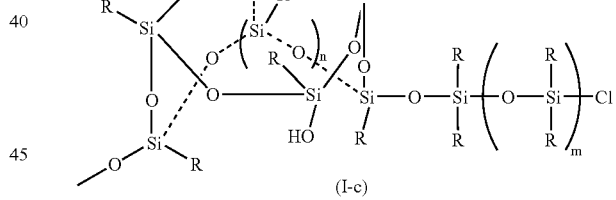

The above Reaction 1 can also be synthesized in the following method.

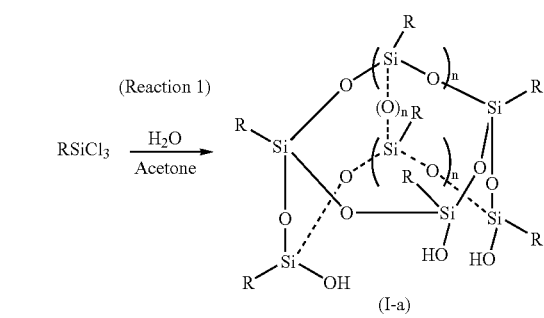

The specific examples of repeating units represented by formula (I) for use in component (A) in the present invention are shown below, but the present invention is not limited thereto. The specific structures shown below can be synthesized by the similar method as the above synthesizing method.
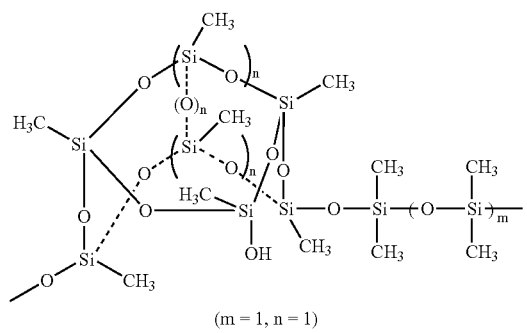
(I-1)
(m = 1, n = 1)
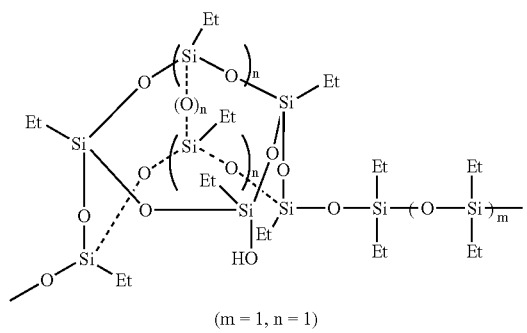
(I-2)
(m = 1, n = 1)
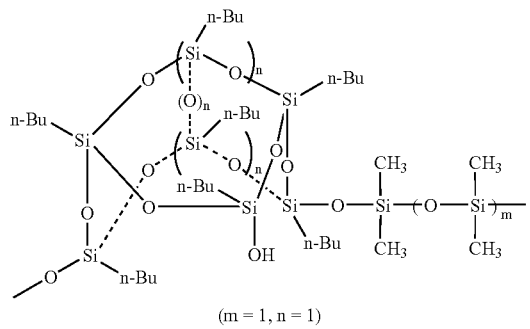
(I-3)
(m = 1, n = 1)
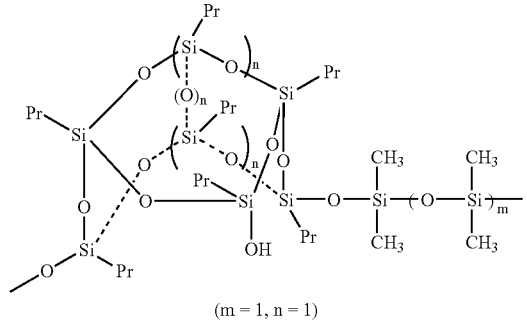
(I-4)
(m = 1, n = 1)
-continued
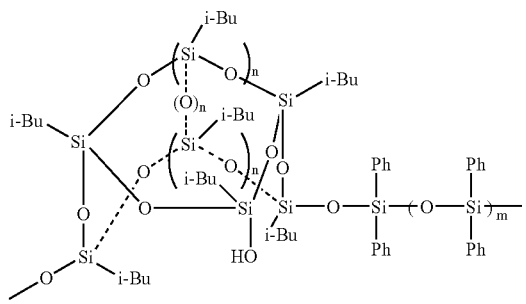
(I-5)
(Ph; Phenyl, m = 1, n = 1)
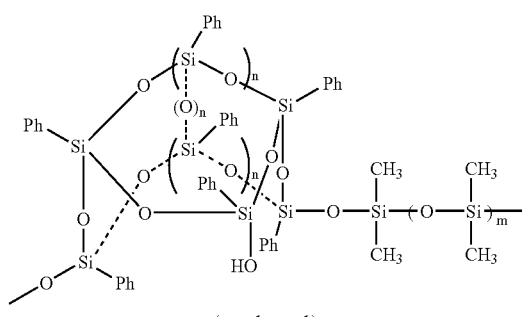
(I-6)
(m = 1, n = 1)
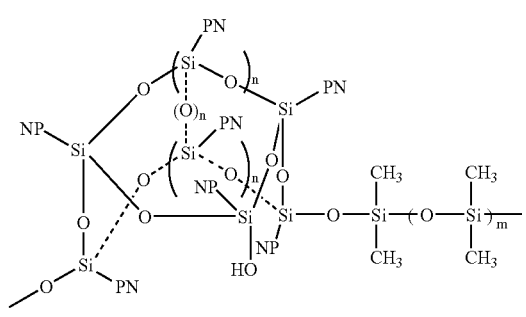
(I-7)
(PN; Phenethyl, m = 1, n = 1)
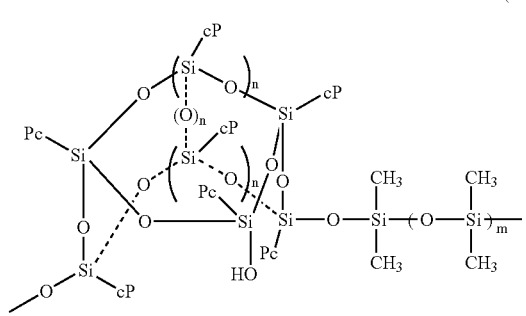
(I-8)
(cp; Cyclopentyl, m = 1, n = 1)

-continued
(I-9)
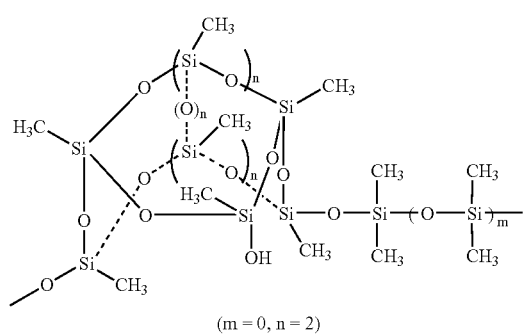
(m = 0, n = 2)
(I-10)
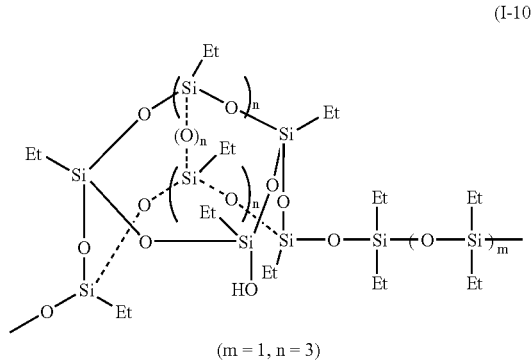
(m = 1, n = 3)
(I-11)
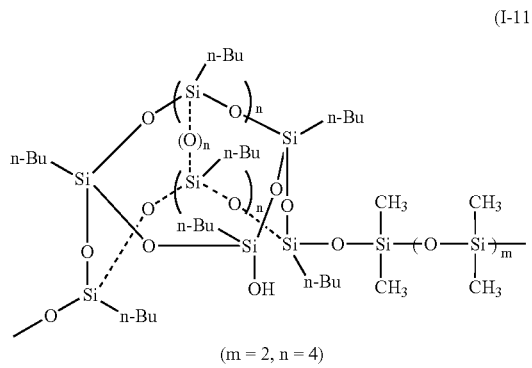
(m = 2, n = 4)
(I-12)
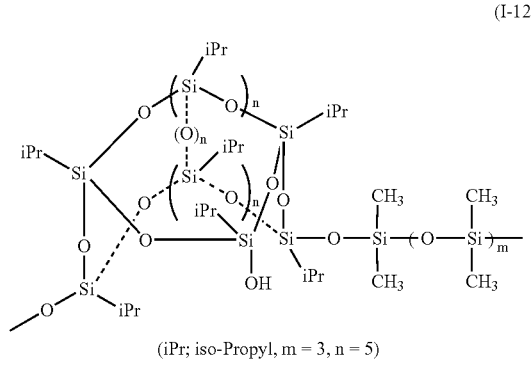
(iPr; iso-Propyl, m = 3, n = 5)
(I-13)
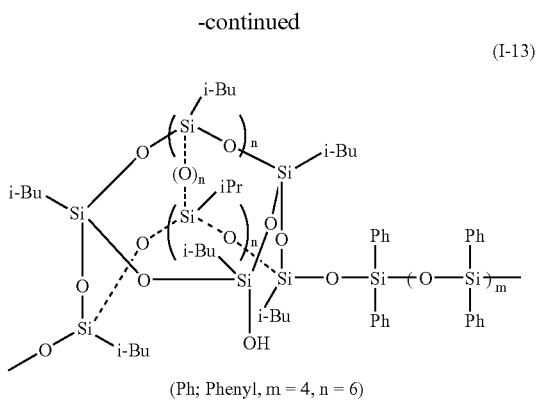
(Ph; Phenyl, m = 4, n = 6)
(I-14)
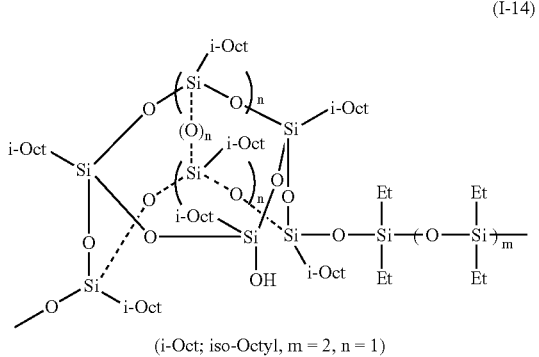
(i-Oct; iso-Octyl, m = 2, n = 1)
(I-15)
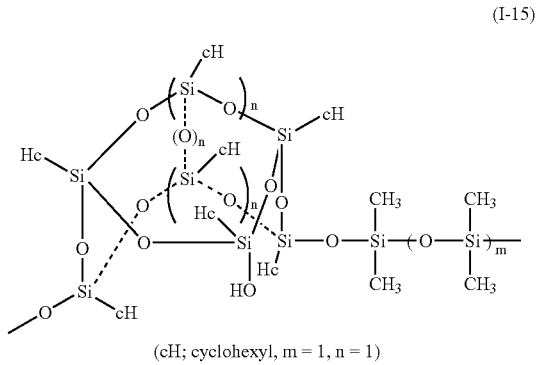
(cH; cyclohexyl, m = 1, n = 1)
(I-16)
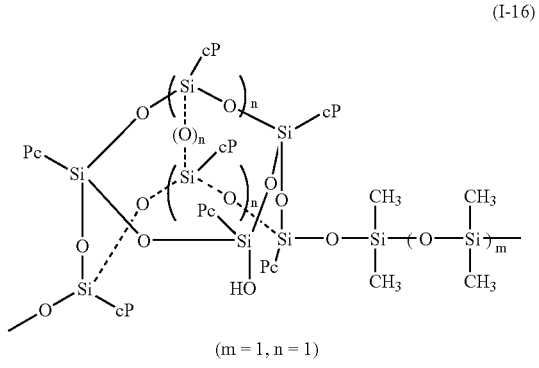
(m = 1, n = 1)

(I-17)
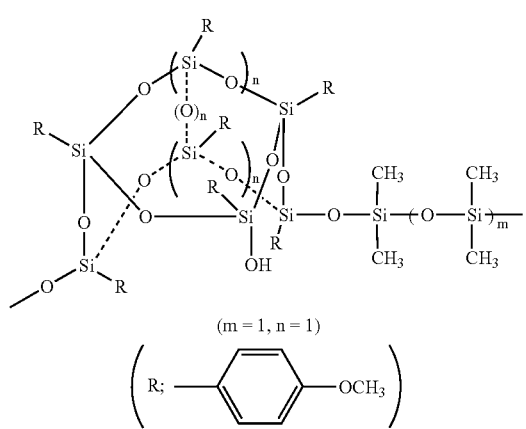
(m = 1, n = 1)
(I-18)
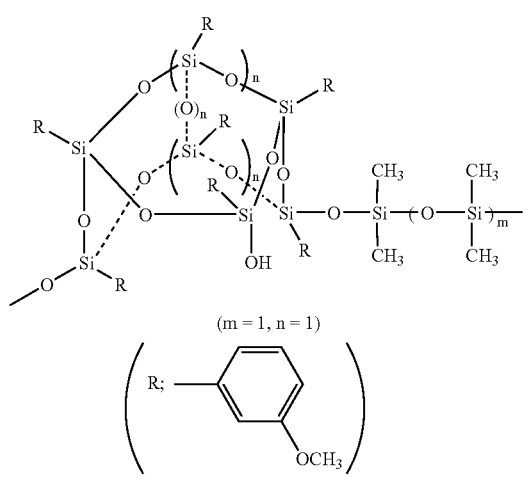
(m = 1, n = 1)
(I-19)
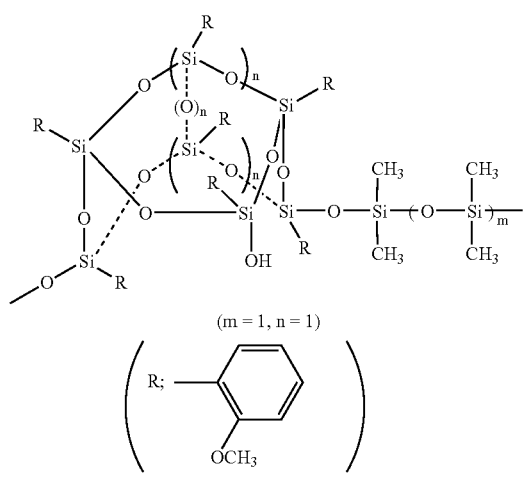
(m = 1, n = 1)
(I-20)
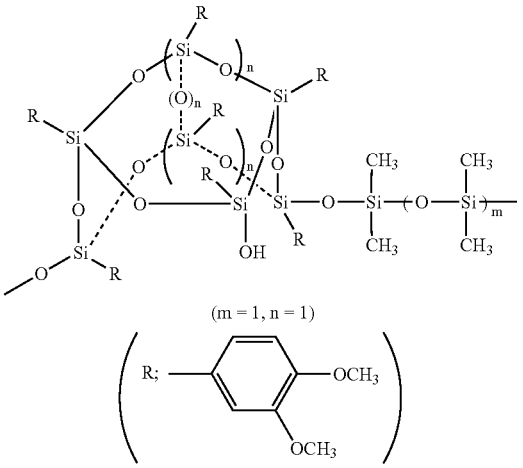
(m = 1, n = 1)
(I-21)
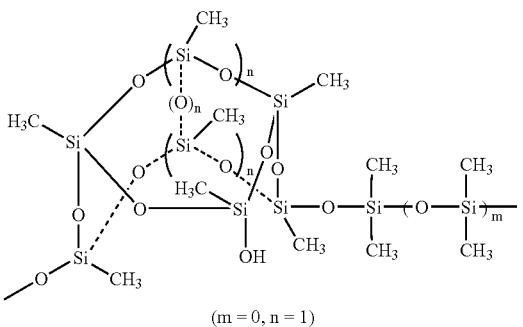
(m = 0, n = 1)
(I-22)
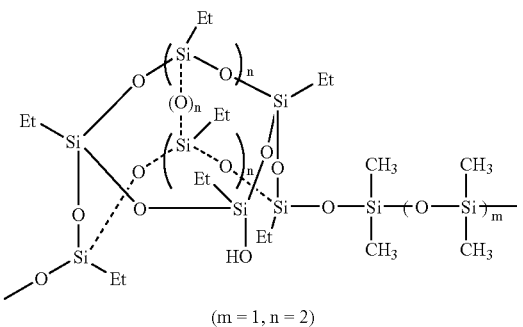
(m = 1, n = 2)
(I-23)
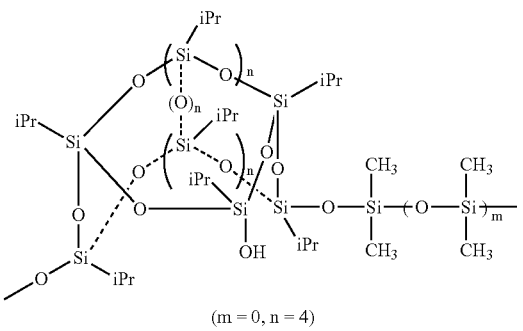
(m = 0, n = 4)

(I-24)
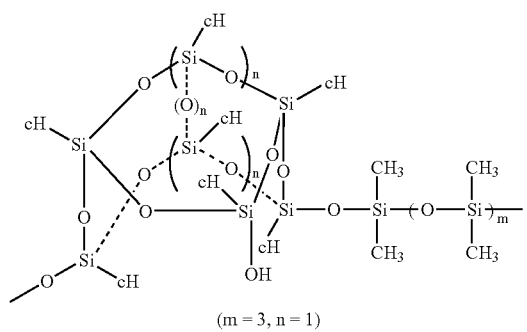
(m = 3, n = 1)
(I-25)
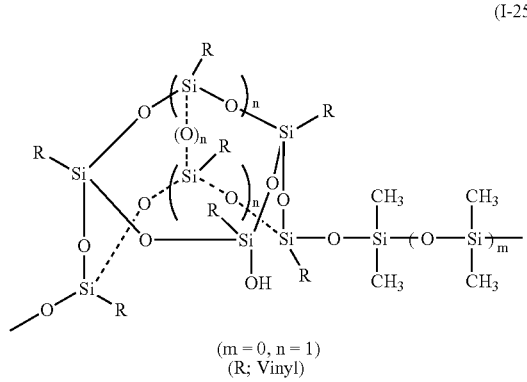
(m = 0, n = 1)
(R; Vinyl)
(I-26)
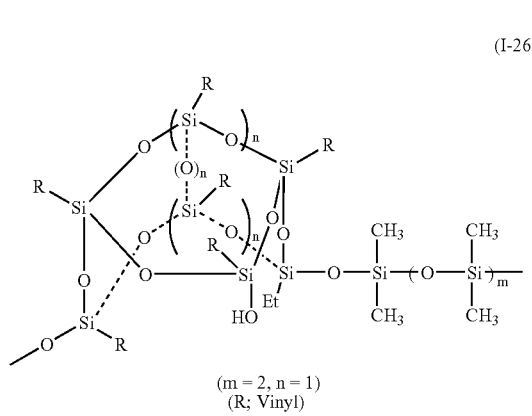
(m = 2, n = 1)
(R; Vinyl)
(I-27)
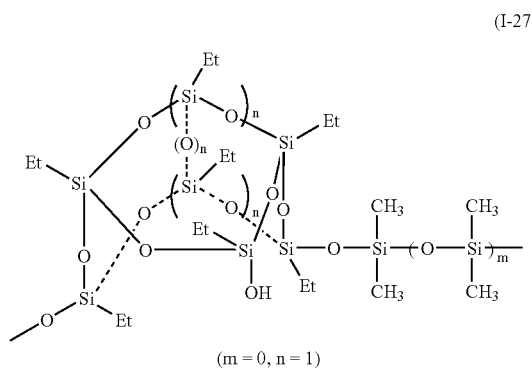
(m = 0, n = 1)
(I-28)
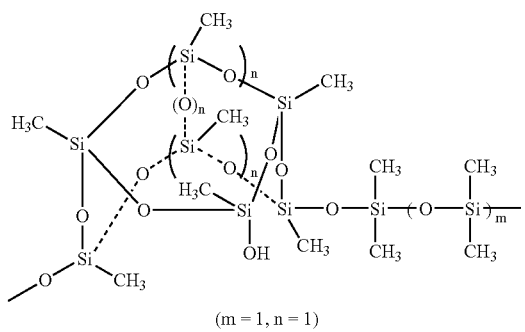
(m = 1, n = 1)
(I-29)
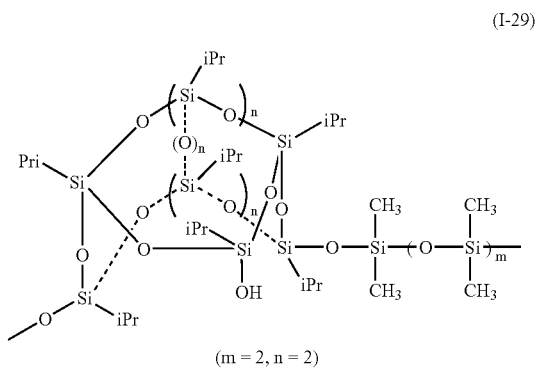
(m = 2, n = 2)
(I-30)
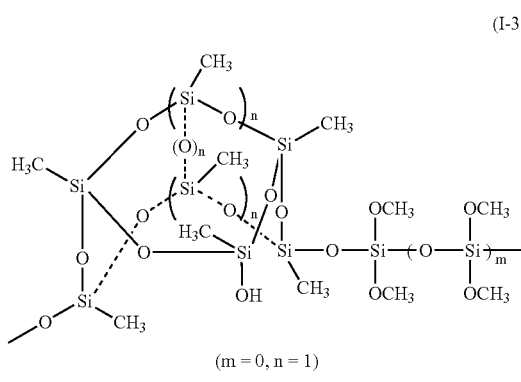
(m = 0, n = 1)
(I-31)
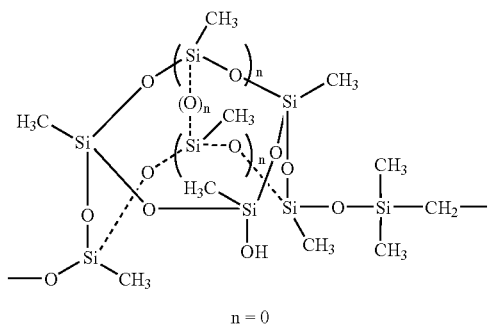
n = 0

-continued (I-32)
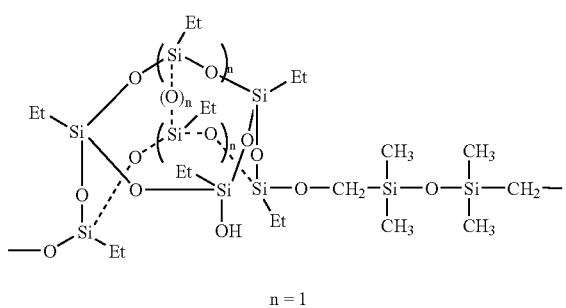
n = 1

(I-33)
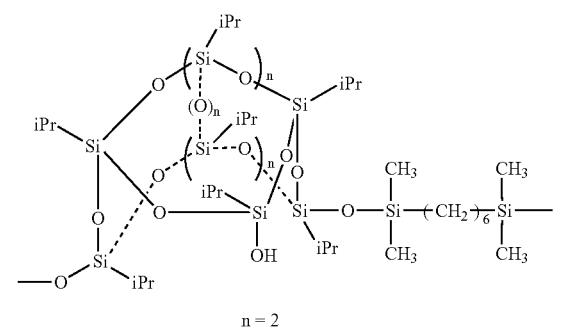
n = 2

(I-34)
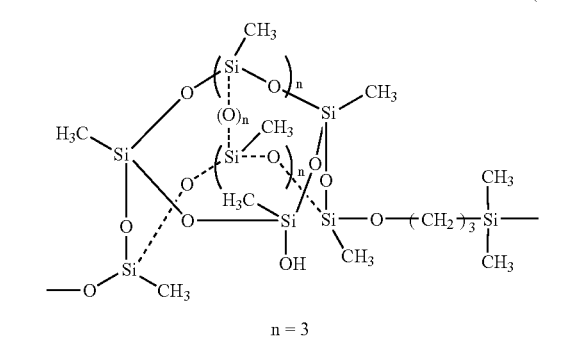
n = 3

(I-35)
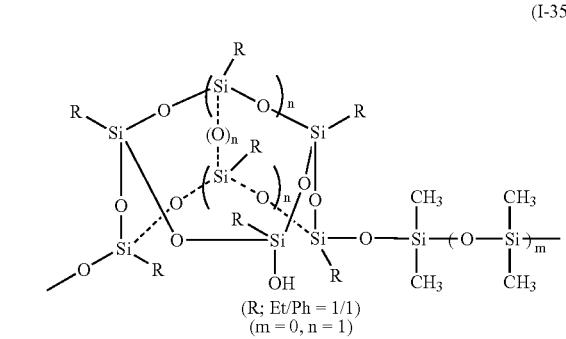
(R; Et/Ph = 1/1)
(m = 0, n = 1)

-continued (I-36)
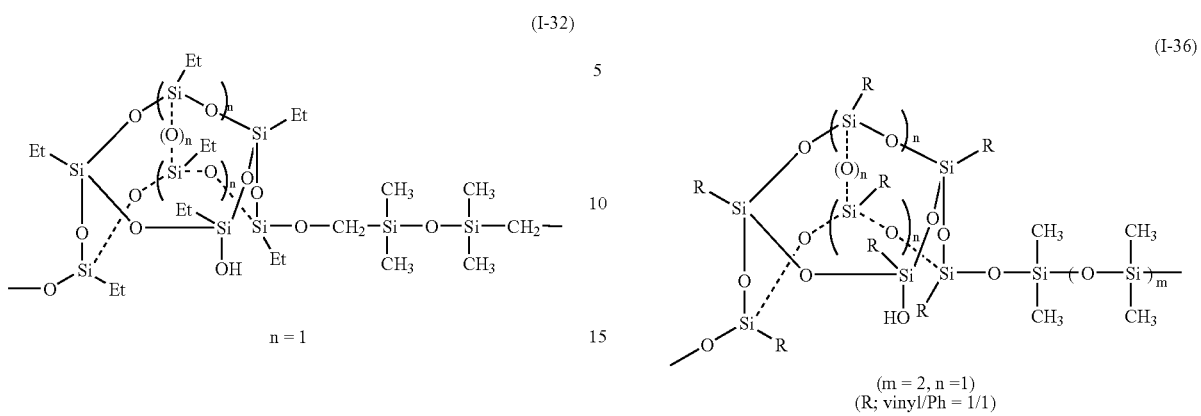
(m = 2, n = 1)
(R; vinyl/Ph = 1/1)

The adhesion property can be maintained in the invention without containing other components, e.g., a crosslinking agent, a radical generator and a polymerizable compound besides the polymers of component (A), but these other components may be used in combination. Other components are described below.

Resins other than the polymers of component (A) can be used in the invention. As resins capable of being used in combination with the polymers of component (A), resins having a phenolic group in the molecule, e.g., polyhydroxystyrene, novolak resins and derivatives of them can be preferably used. Copolymer resins having a p-hydroxystyrene unit can also be used. Poly (p-hydroxystyrene), poly (p/m-hydroxystyrene) copolymers, poly(p/o-hydroxystyrene) copolymers, and poly(p-hydroxystyrene-styrene) copolymers are preferably used. In addition, poly(alkyl-substituted hydroxystyrene) resins, such as poly(4-hydroxy-3-methylstyrene) resins and poly(4-hydroxy-3,5-dimethylstyrene) resins, and the above resins in which the phenolic hydroxyl group is partially alkylated or acetylated are also preferably used.

As the resins that can be used in combination with component (A), e.g., novolak resins, hydrogenated novolak resins, acetone-pyrogallol resins, polyhydroxystyrene, alkyl-substituted polyhydroxystyrene, poly(hydroxystyrene-N-substituted maleimide) copolymers, partially O-alkylated products of polyhydroxystyrene, partially O-acylated products of polyhydroxystyrene, poly(styrene-maleic anhydride) copolymers, poly(styrene-hydroxystyrene) copolymers, and hydrogenated polyhydroxystyrene can be exemplified, but the invention is not limited to these resins.

The particularly preferred resins that can be used in combination with component (A) are novolak resins, resins having a p-hydroxystyrene unit, preferably poly(p-hydroxystyrene), poly(p/m-hydroxystyrene) copolymers, poly(p/o-hydroxystyrene) copolymers, poly(p-hydroxystyrene-styrene) copolymers, poly(alkyl-substituted hydroxystyrene) resins, e.g., poly(4-hydroxy-3-methylstyrene) resin, poly(4-hydroxy-3,5-dimethylstyrene) resins, the above resins in which the phenolic hydroxyl group is partially alkylated or acetylated, partially hydrogenated polyhydroxystyrene resins, polyhydroxystyrene resins, partially hydrogenated novolak resins, and partially hydrogenated polyhydroxystyrene resins.

In the present invention, polyhydroxystyrene means polymers obtained by polymerizing at least one kind of monomer selected from the group consisting of a p-hydroxystyrene monomer, an m-hydroxystyrene monomer, an o-hydroxystyrene monomer, and hydroxystyrene monomers obtained by substituting the ortho position with an alkyl group having from 1 to 4 carbon atoms from the bonding position of the hydroxyl group of the above monomers.

The novolak resins can be obtained by addition condensation to aldehydes with the prescribed monomers as main components in the presence of acid catalysts.

As the prescribed monomers, cresols, e.g., phenol, m-cresol, p-cresol, ando-cresol, xylenols, e.g., 2,5-xylenol, 3,5-xylenol, 3,4-xylenol, and 2,3-xylenol, alkylphenols, e.g., m-ethylphenol, p-ethylphenol, o-ethylphenol, p-t-butylphenol, p-octylphenol, and 2,3,5-trimethylphenol, alkoxyphenols, e.g., p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, and p-butoxyphenol, bisalkylphenols, e.g., 2-methyl-4-isopropyl-phenol, and hydroxyl aromatic compounds, e.g., dihydroxy-biphenyl, bisphenol A, phenylphenol, resorcinol and naphthol can be used alone or two or more compounds can be used in combination, but the present invention is not limited to these compounds.

The examples of aldehydes include, e.g., formaldehyde, paraformaldehyde, acetaldehyde, propylaldehyde, benzaldehyde, phenylacetaldehyde, p-phenylpropylaldehyde, β-phenylpropyl-aldehyde, o-hydroxybenzaldehyde, m-hydroxybenzaldehyde, p-hydroxybenzaldehyde, o-nitrobenzaldehyde, m-nitrobenz-aldehyde, p-nitrobenzaldehyde, o-methylbenzaldehyde, m-methylbenzaldehyde, p-methylbenzaldehyde, p-ethylbenz-aldehyde, p-n-butylbenzaldehyde, furfural, and acetalized products of these aldehydes. Of these aldehydes, it is preferred to use formaldehyde.

These aldehydes can be used alone or in combination of two or more As acid catalysts, sulfuric acid, formic acid, acetic acid and oxalic acid can be used.

These resins usable in combination with component (A) have functions of increasing adhesion of an intermediate layer and an upper layer resist in a three-layer resist process, and improving thermosetting characteristics of an intermediate layer.

The use amount of these resins usable in combination with component (A) is preferably from 5 to 50 mass % based on the total solid contents. The amount of 5 mass % or more is preferred in view of the addition effect, and 50 mass % or less is preferred for maintaining Si content. The more preferred amount of resins usable in combination with component (A) is from 10 to 40 mass %, and from 15 to 35 mass % is still more preferred.

In the next place, components that can be used in an intermediate layer are described below.

(2) Component (B) For Use in the Intermediate Layer Composition of the Invention:

The intermediate layer composition of the invention can contain (B) a radical generator (an azo series initiator, peroxide). The use amount of component (B) is generally from 0.0005 to 5 mass %, preferably from 0.0007 to 1 mass, based on the solid contents in the intermediate layer component.

The examples of radical generators as component (B) are shown below.

As radical generators, peroxide and azo series initiators generally used can be used, preferably azo series generators. As azo generators, 2,2'-azobis(4-methoxy-2,4-dimethylvaleronitrile), 2,2'-azobis(2-cyclopropylpropio-nitrile), 2,2'-azo-bis(2,4-dimethylvaleronitrile), 2,2'-azobisisobutyronitrile, 2,2'-azobis (2-methylbutyronitrile), 1,1'-azobis(cyclohexane-1-carbonitrile), 2,2'-azobis(2-methyl-N-phenylpropionamidine) dihydrochloride, 2,2'-azobis-(2-methyl-N-2-propenylpropionamidine)dihydrochloride, 2,2'-azobis[2-(5-methyl-2-imidazolin-2-yl)propane]dihydro-chloride, 2,2'-azobis{2-methyl-N-[1,1-bis(hydroxymethyl)-2-hydroxyethyl]propionamide}, dimethyl-2,2'-azobis(2-methyl-propionate), 4,4'-azobis(4-cyanovaleric acid), and 2,2'-azobis[2-(hydroxymethyl)propionitrile] can be exemplified.

Preferred radical generators are 2,2'-azobis(2,4- dimethylvaleronitrile), 2,2'-azobisisobutyronitrile, 2,2'-azobis(2-methylbutyronitrile), 1,1'-azobis(cyclo-hexane-1-carbonitrile), dimethyl-2,2'-azobis(2-methyl-propionate), 4,4'-azobis(4-cyanovaleric acid), and 2,2'-azobis[2-(hydroxymethyl)propionitrile].

The onium salts shown below can also be used in the invention. Specifically, iodonium salts, diazonium salts and sulfonium salts can be exemplified. These onium salts have also a function as acid generators, but when used in combination with radical polymerizable compounds, they function as radical polymerization initiators. The onium salts preferably used in the invention are noium salts represented by the following formula (1), (2) or (3).

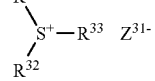

In formula (1), $Ar^{11}$ and $Ar^{12}$ each represents an aryl group having 20 or less carbon atoms which may have a substituent. The examples of preferred substituents of the aryl group include a halogen atom, a nitro group, an alkyl group having 12 or less carbon atoms, an alkoxyl group having 12 or less carbon atoms, and an aryloxy group having 12 or less carbon atoms. $Z^{11-}$ represents a counter ion selected from the group consisting of a halogen ion, a perchlorate ion, a tetrafluoro-borate ion, a carboxylate ion, a hexafluorophosphate ion, and a sulfonate ion, and preferably a perchlorate ion, a carboxylate ion, a hexafluorophosphate ion, and an arylsulfonate ion.

In formula (2), $Ar^{21}$ represents an aryl group having 20 or less carbon atoms which may have a substituent. The examples of preferred substituents of the aryl group include a halogen atom, a nitro group, an alkyl group having 12 or less carbon atoms, an alkoxyl group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms. $Z^{21-}$ represents a counter ion having the same meaning as $Z^{11-}$.

In formula (3), $R^{31}$, $R^{32}$ and $R^{33}$, which may be the same or different, each represents a hydrocarbon group having 20 or less carbon atoms which may have a substituent. The examples of preferred substituents of the hydrocarbon group include a halogen atom, a nitro group, an alkyl group having 12 or less carbon atoms, an alkoxyl group having 12 or less carbon atoms, and an aryloxy group having 12 or less carbon atoms. $Z^{31-}$ represents a counter ion having the same meaning as $Z^{11-}$.

As the specific examples of onium salts preferably used in the invention, onium salts disclosed in JP-A-2001-133969, paragraphs from [0030] to [0033], and the triazine compounds having a trihalogen methyl group as disclosed in U.S. Pat. No. 6,309,792, and JP-A-4-274429 (the term "JP-A" as used herein means an "unexamined published Japanese patent application"), Example 2 are exemplified.

Onium salts can be used in an amount of from 0.1 to 50 mass %, preferably from 0.5 to 30 mass %, and particularly preferably from 1 to 20 mass %, based on the total solid contents.

(3) Crosslinking Agent (Component (C)) For Use in the Intermediate Layer Composition of the Invention:

The intermediate layer composition of the invention can contain a crosslinkable compound by acid (hereinafter sometimes referred to as acid-crosslinking agent or merely a crosslinking agent).

(3)-1 Phenol Derivative

Phenol derivatives can be used as a crosslinking agent. As the phenol derivatives, phenol derivatives having a molecular weight of preferably 1,200 or less, from 3 to 5 benzene rings in the molecule, and 2 or more in total of hydroxymethyl groups or alkoxymethyl groups, wherein the hydroxymethyl groups or the alkoxymethyl groups are bonded to at least any benzene ring convergently, or distributed to several benzene rings are exemplified. By using such phenol derivatives, the effect of the invention can be more conspicuously exhibited.

As the alkoxymethyl groups bonded to a benzene ring, those having 6 or less carbon atoms are preferred, specifically a methoxymethyl group, an ethoxymethyl group, an n-propoxymethyl group, an i-propoxymethyl group, an n-butoxymethyl group, an i-butoxymethyl group, a sec-butoxymethyl group, and a t-butoxymethyl group are preferred. Further, an alkoxyl-substituted alkoxyl group, e.g., a 2-methoxyethoxy group and a 2-methoxy-1-propyl group are also preferred.

Of these phenol derivatives, particularly preferred derivatives are shown below

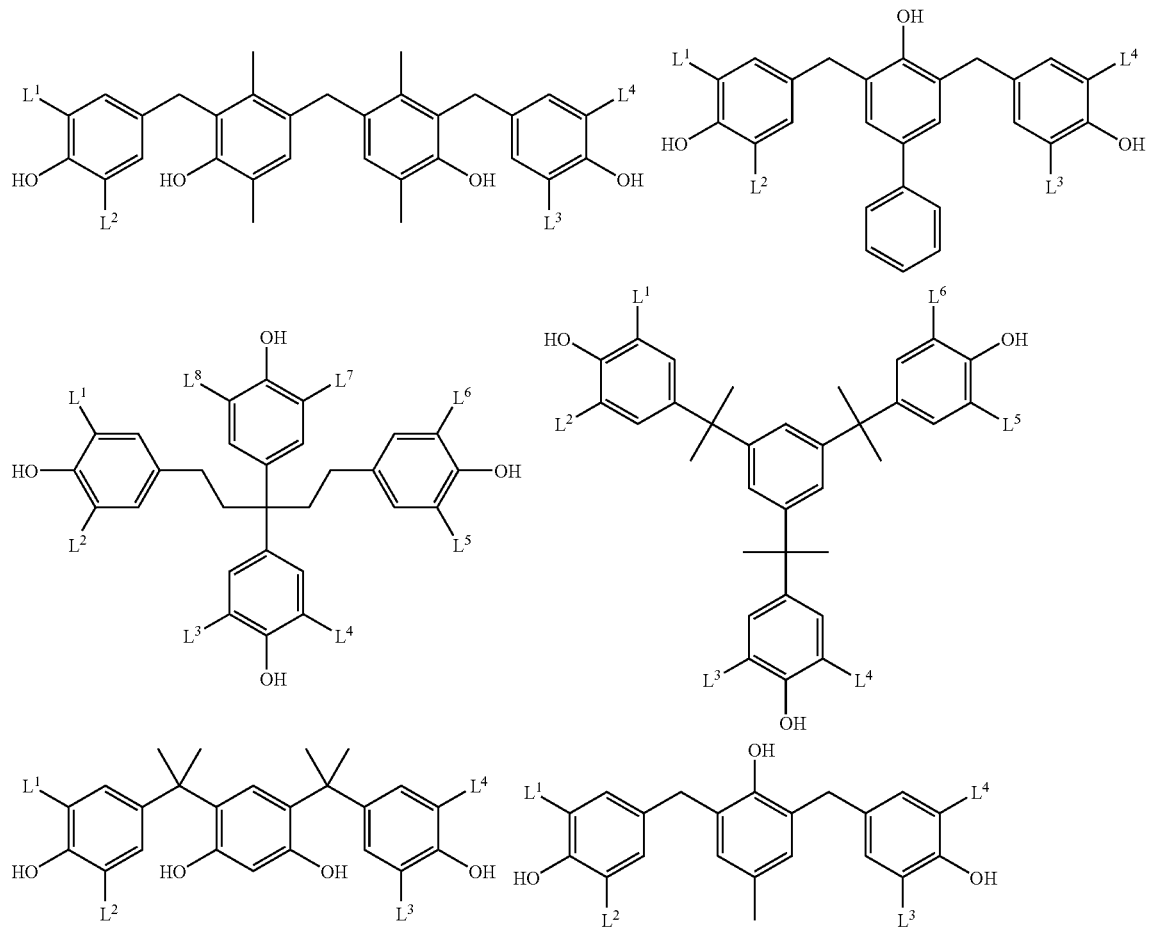

-continued
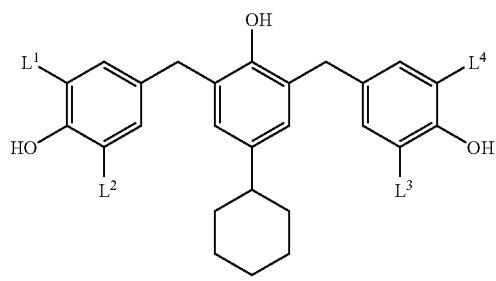
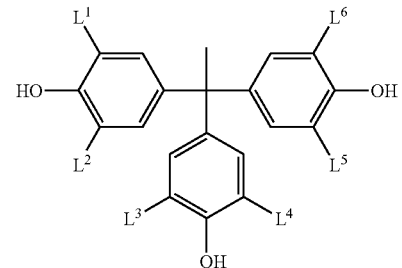
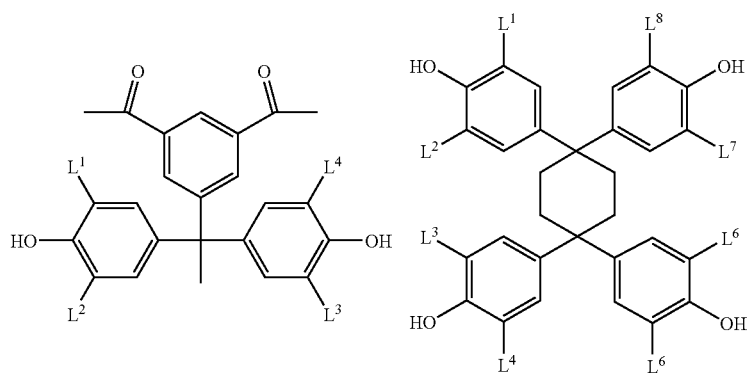
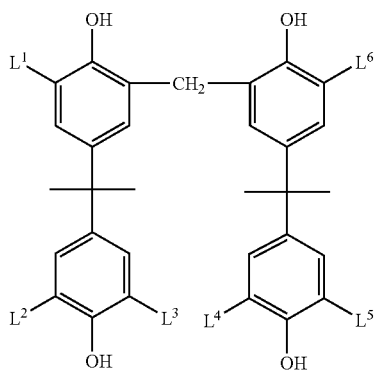
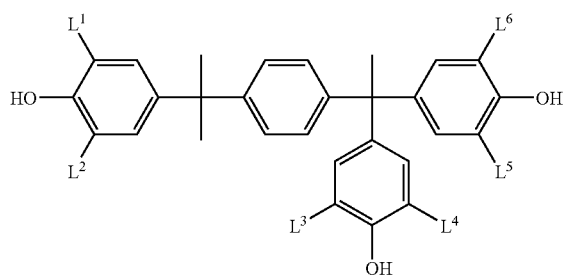
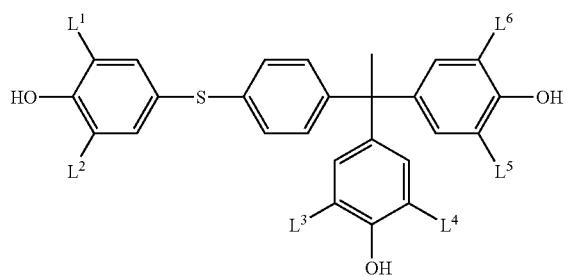
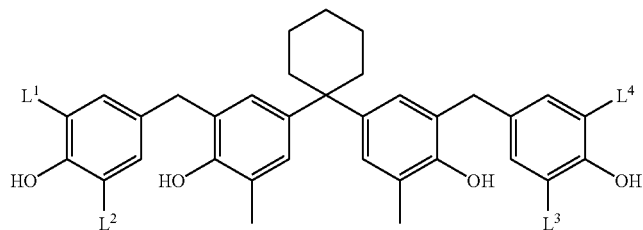

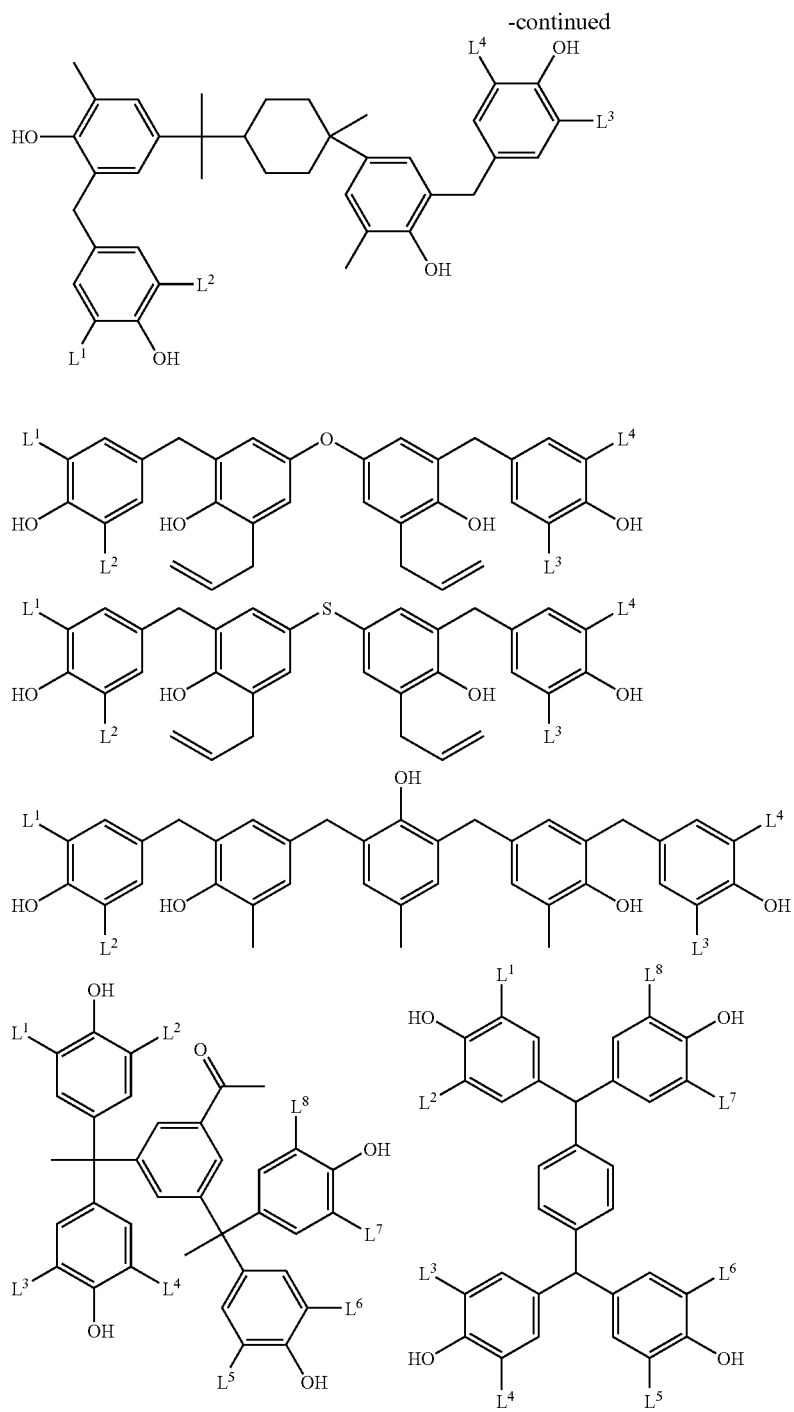

In the formulae, $L^1$ to $L^8$, which may be the same or different, each represents a hydroxymethyl group, a methoxy-methyl group or an ethoxymethyl group.

A phenol derivative having a hydroxymethyl group can be obtained by the reaction of a corresponding phenol compound not having a hydroxymethyl group (compounds in which $L^1$ to $L^8$ represent a hydrogen atom in the above formulae) with formaldehyde in the presence of a basic catalyst. At this time, it is preferred that the reaction temperature be 60° C. or less for preventing resinification and gelation. Specifically, the phenol derivative can be synthesized by the methods disclosed in JP-A-6-282067 and JP-A-7-64285.

A phenol derivative having an alkoxymethyl group can be obtained by the reaction of a corresponding phenol derivative having a hydroxymethyl group with an alcohol in the presence of an acid catalyst. At this time, it is preferred that the reaction temperature be 100° C. or less for preventing resinification and gelation. Specifically, the phenol derivative can be synthesized by the methods disclosed in EP-A-632003 and the like.

Phenol derivatives having a hydroxymethyl group or an alkoxymethyl group thus synthesized are preferred in the point of preservation stability, and phenol derivatives having an alkoxymethyl group are particularly preferred from the viewpoint of preservation stability.

These phenol derivatives having 2 or more in total of hydroxymethyl groups or alkoxymethyl groups bonded to any benzene ring convergently or distributed to several benzene rings may be used alone or in combination of two or more.

(3)-2 Other Crosslinking Agents

Besides the above phenol derivatives, the following compounds (i) and (ii) can be used as crosslinking agents.
(i) Compounds having an N-hydroxymethyl group, an N-alkoxymethyl group or an N-acyloxymethyl group
(ii) Epoxy compounds These crosslinking agents are described in detail below.

As (i) compounds having an N-hydroxymethyl group, an N-alkoxymethyl group or an N-acyloxymethyl group, monomers, oligomer-melamine-formaldehyde condensation products and urea-formaldehyde condensation products disclosed in EP-A-0133216, West German Patents 3,634,671 and 3,711,264, and benzoguanamine-formaldehyde condensation products disclosed in the alkoxy-substituted compounds disclosed in EP-A-0212482 are exemplified.

Further, the glycoluril derivatives represented by the following formula can be used.

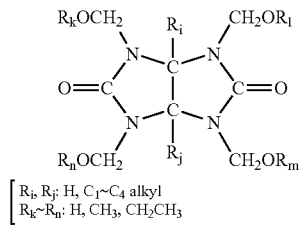

$$\begin{bmatrix} R_i, R_j: H, C_1 \sim C_4 \text{ alkyl} \\ R_k \sim R_n: H, CH_3, CH_2CH_3 \end{bmatrix}$$

As the more preferred examples, melamine-formaldehyde derivatives having at least two free N-hydroxymethyl groups, N-alkoxymethyl groups or N-acyloxymethyl groups are exemplified, and N-alkoxymethyl derivative is particularly preferred.

As (ii) epoxy compounds, monomeric, dimeric, oligomeric and polymeric epoxy compounds can be exemplified. For example, the reaction products of bisphenol A and epichlorohydrin and the reaction products of low molecular weight phenol-formaldehyde resin and epichlorihydrin are exemplified. In addition to the above compounds, epoxy resins as disclosed in U.S. Pat. No. 4,026,705 and British Patent 1,539,192 are exemplified.

In the present invention, the above phenol derivatives are preferably used.

The above crosslinking agents (i) and (ii) can be used in combination with the above phenol derivatives.

The ratio of other crosslinking agents usable in combination with the above phenol derivatives is from 100/0 to 20/80 in molar ratio, preferably from 90/10 to 40/60, and more preferably from 80/20 to 50/50.

The addition amount of crosslinking agents preferably accounts for from 3 to 70 mass % of the solid contents of the intermediate layer composition, more preferably from 5 to 50 mass %. The addition amount of 3 mass % or more is preferred for good residual film rate, and 70 mass % or less is preferred for (4) Compound Capable of Decomposing by Heating and Generating Acid (Component (D)) for Use in the Intermediate Layer Composition of the Invention The intermediate layer composition of the invention can contain a compound capable of decomposing by heating and generating an acid (hereinafter sometimes referred to as an acid generator).

In the present invention, an acid generator means a compound capable of generating an acid by heating at 100° C. or more. Acid generators preferably used in the invention include photo-initiators of photo-cationic polymerization, photo-initiators of photo-radical polymerization, photo-decoloring agents and photo-discoloring agents of dyes and, in addition, well-known acid generators, well-known compounds generating acids upon thermal decomposition, and mixtures of these compounds used in micro resists and the like, and these acid generators can be used by arbitrary selection.

As acid generators, e.g., the following compounds are exemplified: onium salts, e.g., diazonium salts described in S. I. Schlesinger, Photogr. Sci. Eng., 18, 387, (1974), and T. S. Bal et al., Polymer, 21, 423 (11980), ammonium salts described in U.S. Pat. Nos. 4,069,055, 4,069,056, Re 27,992, and JP-A-4-365049, phosphonium salts described in D. C. Necker et al, Macromolecules, 17, 2468 (1984), C. S. Wen et al., Teh, Proc. Conf. Rad. Curing ASIA, p. 478, Tokyo, Oct (1988), U.S. Pat. Nos. 4,069,055 and 4,069,056, iodonium salts described in J. V. Crivello et al., Macromolecules, 10 (6), 1307 (1977), Chem. & Eng. News, Nov. 28, p. 31 (1988), EP-104143, U.S. Pat. Nos. 339,049, 410,201, JP-A-2-150848 and JP-A-2-296514, sulfonium salts described in J. V. Crivello et al., Polymer J., 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer. Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), EP-370693, EP-390214, EP-233567, EP-297443, EP-297442, U.S. Pat. Nos. 4,933,377, 161,811, 410,201, 339,049, 4,760,013, 4,734,444, 2,833,827, German Patents 2,904,626, 3,604,580 and 3,604,581, selenonium salts described in J. V. Crivello et al., Macromolecules, 10 (6), 1307 (1977), J. V. Crivello et al., J. Polymer Sci., Polymer Chem. Ed., 17, 1047 (1979), and arsonium salts described in C. S. Wen et al., Teh, Proc. Conf. Rad. Curing ASIA, p. 478, Tokyo, Oct (1988); organic halogen compounds described in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; organic metal/organic halogen compounds described in K. Meier et al., J. Rad. Curing, 13 (4), 26 (1986), T. P. Gill et al., Inorg. Chem., 19, 3007 (1980), D. Astruc, Acc. Chem. Res., 19 (12), 377 (1896), and JP-A-2-161445; photo-acid generators having an o-nitrobenzyl type protective group described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amitetal., Tetrahedron Lett., (24) 2205 (1973), D. H. R. Barton et al., J. Chem. Soc., 3571 (1965), P. M. Collins et al., J. Chem. Soc., Perkin I, 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Soc., Chem. Commun., 532 (1972), S. Hayase et al., Macro-molecules, 18, 1799 (1985), E. Reichmanis et al., J.

*Electro-chem. Soc.*, Solid State Sci. Technol., 130 (6), F. M. Houlihan et al., *Macromolecules*, 21, 2001 (1988), EP-0290750, EP-046083, EP-156535, EP-271851, EP-0388343, U.S. Pat. Nos. 3,901,710, 4,181,531, JP-A-60-198535 and JP-A-53-133022; compounds capable of generating a sulfonic acid upon photo-decomposition represented by iminosulfonate described in M. Tunooka et al., *Polymer Preprints, Japan,* 38 (8), G. Berner et al., *J. Rad. Curing,* 13 (4), W. J. Mijs et al., *Coating Technol.,* 55 (697), 45 (1983), Akzo, H. Adachi et al., Polymer Preprints, Japan, 37 (3), EP-0199672, EP-84515, EP-199672, EP-044115, EP-0101122, U.S. Pat. Nos. 4,618,564, 4,371,605, 4,431,7714, JP-A-64-18143, JP-A-2-245756, and Japanese Patent Application No. 3-140109; and disulfone compounds disclosed in JP-A-61-166544.

The compounds having introduced these groups or compounds generating an acid to the main chains or side chains of polymers can be used, e.g., the compounds described in M. E. Woodhouse et al., *J. Am. Chem. Soc.,* 104, 5586 (1982), S. P. Pappas et al., *J. Imaging Sci.,* 30 (5), 218 (1986), S. Kondoetal., *Makromol. Chem.*, Rapid Commun., 9, 625 (1988), Y. Yamada et al., *Makromol. Chem.,* 152, 153, 163 (1972), J. V. Crivello et al., *J. Polymer Sci.*, Polymer Chem. Ed., 17, 3845 (1979), U.S. Pat. No. 3,849,137, German Patent 3,914,407, JP-A-63-26653, JP-A-55-164824, JP-A-62-69263, JP-A-63-146037, JP-A-63-163452, JP-A-62-153853 and JP-A-63-146029 are exemplified.

Further, compounds capable of generating an acid by light can also be used in the invention, and as such compounds, those described e.g., in V. N. R. Pillai, *Synthesis*, (1), 1 (1980), A. Abe et al., *Tetrahedron Lett.*, (47) 4555 (1971), D. H. R. Barton et al., *J. Chem. Soc.*, (C), 329 (1970, U.S. Pat. No. 3,779,778, and EP-126712 are exemplified.

Of these compounds, acid generators represented by the following formula (I), (II), (III), (IV) or (V) are particularly preferably used in the present invention.

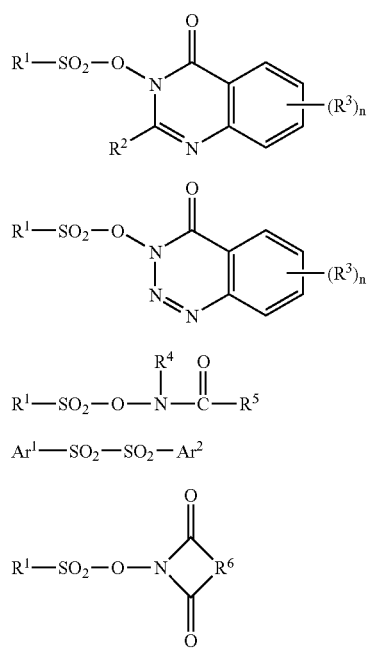

In the formulae, $R^1$, $R^2$, $R^4$ and $R^5$, which may be the same or different, each represents a hydrocarbon group having 20 or less carbon atoms which may have a substituent; $R^3$ represents a halogen atom, a hydrocarbon group having 10 or less carbon atoms which may have a substituent, or an alkoxyl group having 10 or less carbon atoms; $Ar^1$ and $Ar^2$, which may be the same or different, each represents an aryl group having 20 or less carbon atoms which may have a substituent; $R^6$ represents a divalent hydrocarbon group having 20 or less carbon atoms which may have a substituent; and n represents an integer of from 0 to 4.

In formulae (I) to (V), $R^1$, $R^2$, $R^4$ and $R^5$ each represents a hydrocarbon group having 20 or less carbon atoms which may have a substituent, preferably a hydrocarbon group having from 1 to 14 carbon atoms.

The specific examples of hydrocarbon groups include an alkyl group, (e.g., a methyl group, an ethyl group, an n-propyl group, an i-propyl group, an n-butyl group, a sec-butyl group, a t-butyl group, a hexyl group, a cyclohexyl group, an octyl group, a 2-ethylhexyl group, an undecyl group and a dodecyl group), an alkenyl group, (e.g., an allyl group, a vinyl group, a 1-methylvinyl group and a 2-phenylviny group), an aralkyl group, (e.g., abenzyl group), and an aryl group, (e.g., aphenyl group, a tolyl group, a xylyl group, a cumenyl group, a mesityl group, a dodecylphenyl group, a phenylphenyl group, a naphthyl group and an anthracenyl group).

These hydrocarbon groups may have a substituent, e.g., a halogen atom, an alkoxyl group, a nitro grop, a cyano group, or a carboxyl group. The specific examples of hydrocarbon groups having a substituent include a trifluoromethyl group, a chloroethyl group, a 2-methoxyethyl group, a fluorophenyl group, a chlorophenyl group, a bromophenyl group, an iodophenyl group, a methoxyphenyl group, a phenoxyphenyl group, a methoxyphenylvinyl group, a nitrophenyl group, a cyanophenyl group, a carboxyphenyl group and a 9,10-dimethoxyanthracenyl group.

$R^3$ represents a halogen atom, a hydrocarbon group having 10 or less carbon atoms which may have a substituent (e.g., an alkyl group, an alkenyl group, an aralkyl group, an aryl group), or an alkoxyl group having 10 or less carbon atoms.

Specifically, a halogen atom (e.g., fluorine, chlorine, bromine and iodine), a hydrocarbon group (e.g., a methyl group, an ethyl group, an n-propyl group, an i-propyl group, an allyl group, an n-butyl group, a sec-butyl group, a t-butyl group, a hexyl group, a cyclohexyl group, a benzyl group, a phenyl group and a tolyl group), a hydrocarbon group having a substituent (e.g., a 2-methoxyethyl group, a fluorophenyl group, a chlorophenyl group, a bromophenyl group, an iodophenyl group and a methoxyphenyl group), and an alkoxyl group (e.g., a methoxy group and an ethoxy group) are exemplified.

When n represents 2 or more, contiguous two $R^3$ may be condensed to form a ring.

$Ar_1$ and $Ar^2$, which may be the same or different, each represents an aryl group having 20 or less carbon atoms which may have a substituent, preferably an aryl group having from 6 to 14 carbon atoms.

Specifically, a phenyl group, a tolyl group, a xylyl group, a cumenyl group, a mesityl group, a dodecylphenyl group, a phenylphenyl group, a naphthyl group, a fluorophenyl group, a chlorophenyl group, a bromophenyl group, an iodophenyl group, a chloronaphthyl group, a methoxyphenyl group, a phenoxyphenyl group, an ethoxynaphthyl group, a nitrophenyl group, a cyanophenyl group, a carboxyphenyl group, a nitronaphthyl group and an anthracenyl group are exemplified as such aryl groups.

$R^6$ represents a divalent hydrocarbon group having 20 or less carbon atoms which may have a substituent (e.g., analkylene group, an alkenylene group, an aralkylene group or an arylene group).

Specifically, an ethynylene group, a 1,2-cyclo-hexenylene group, a 1,2-phenylene group, a 4-chloro-1,2-phenylene group, a 4-nitro-1,2-phenylene group, a 4-methyl-1,2-phenylene group, a 4-methoxy-1,2-phenylene group, a 4-carboxy-1, 2-phenylene group, and a 1, 8-naphthalenylene group are exemplified as such divalent hydrocarbon groups.

n represents an integer of from 0 to 4. When n represents 0, which represents that $R^3$ is not present, i.e., it represents a hydrogen atom.

Of the compounds represented by formulae (I) to (V), preferred compounds are shown below.

These compounds can be synthesized according to the methods disclosed, e.g., in JP-A-2-100054 and JP-A-2-100055.

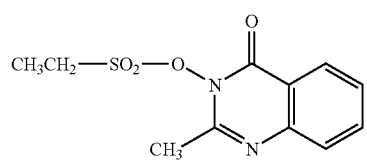
(I-1)

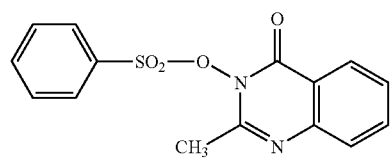
(I-2)

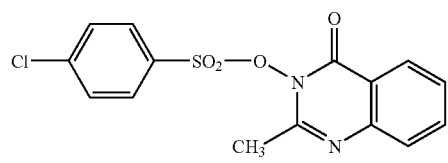
(I-3)

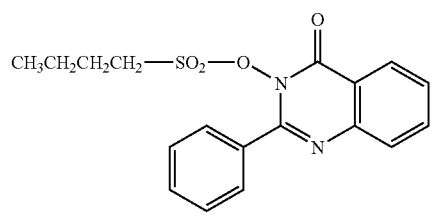
(I-4)

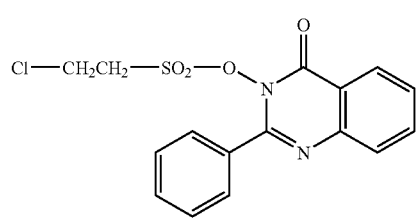
(I-5)

-continued

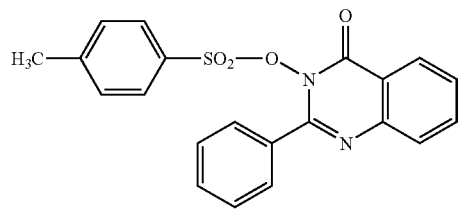
(I-6)

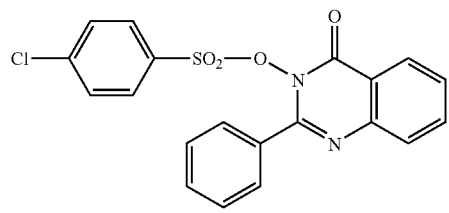
(I-7)

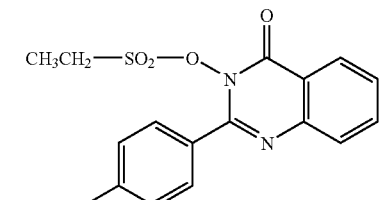
(I-8)

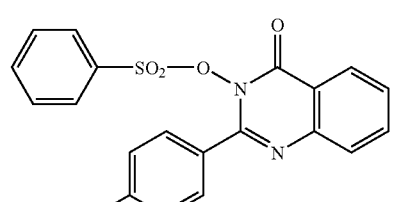
(I-9)

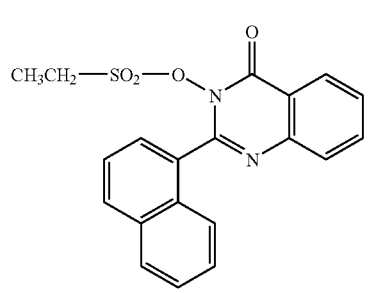
(I-10)

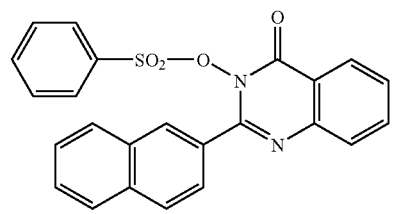
(I-11)

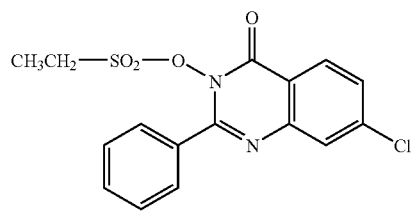
(I-12)

-continued
(I-13)
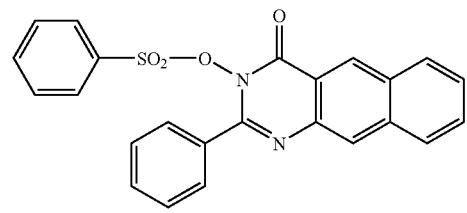
(I-14)
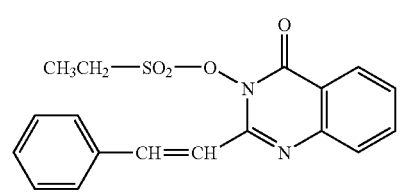
(I-15)
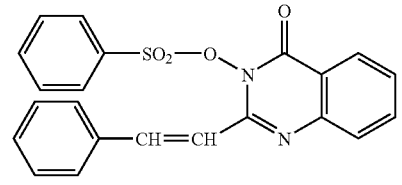
(I-16)
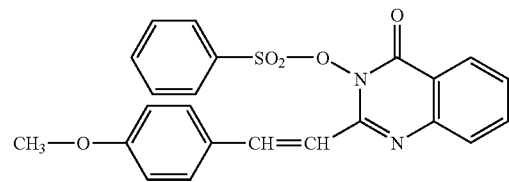
(II-1)
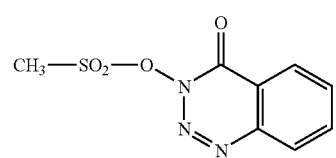
(II-2)
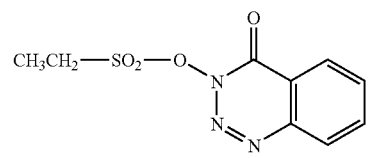
(II-3)
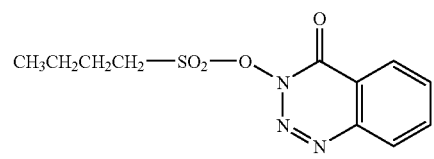
(II-4)
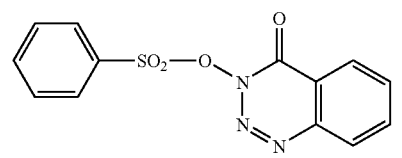
-continued
(II-5)
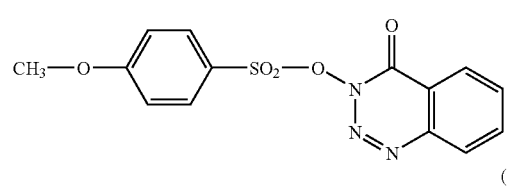
(II-6)
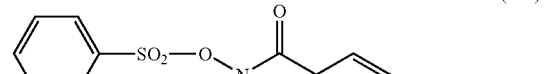
(III-1)
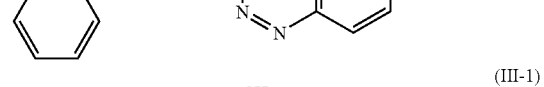
(III-2)
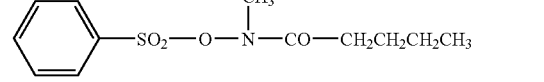
(III-3)
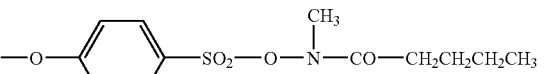
(III-4)
(III-5)
(III-6)
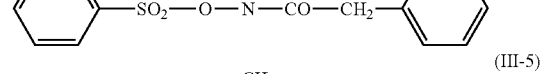
(III-7)
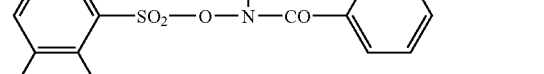
(III-8)
(III-9)
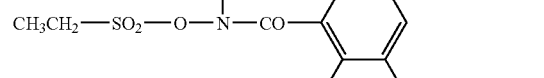

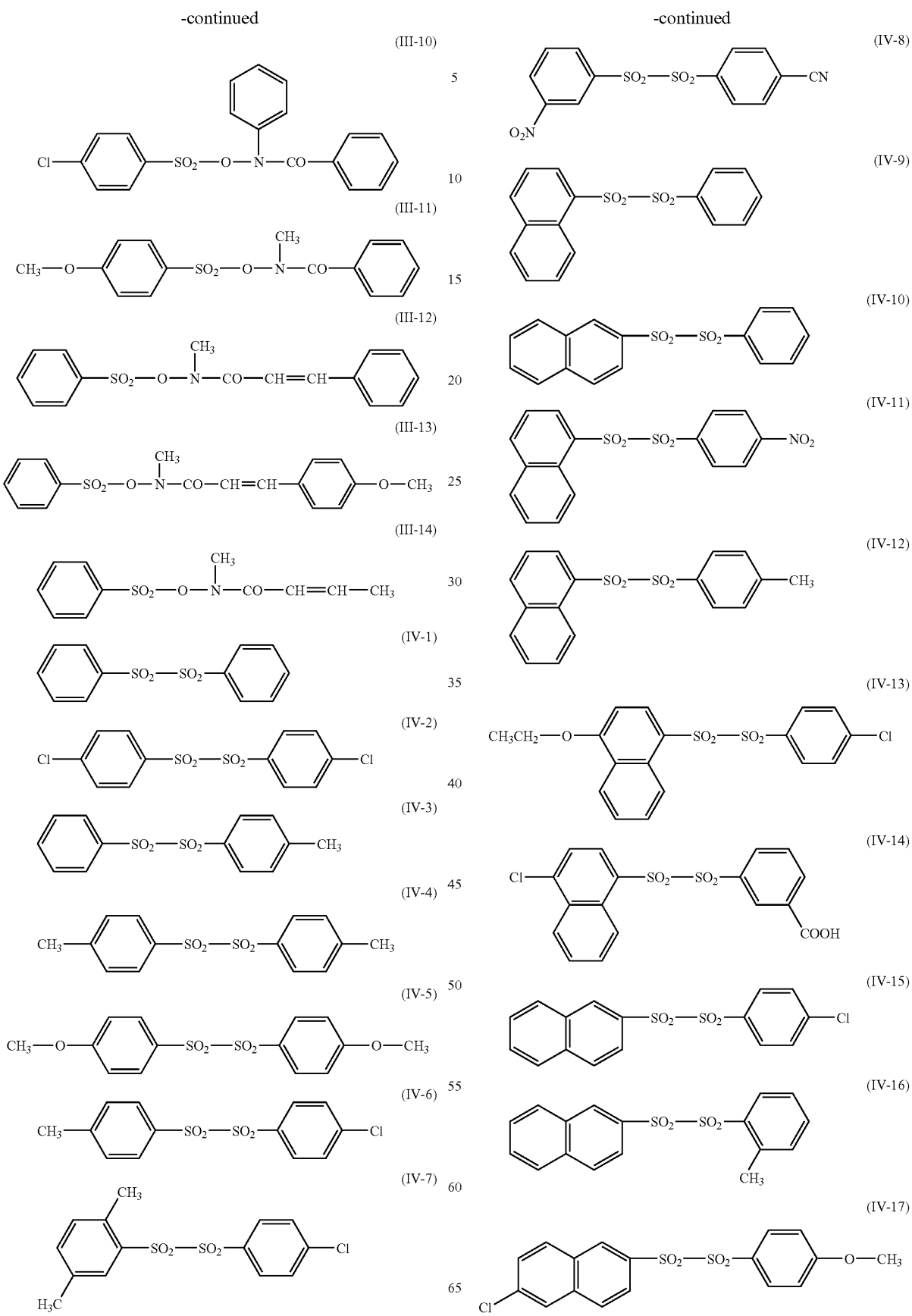

-continued
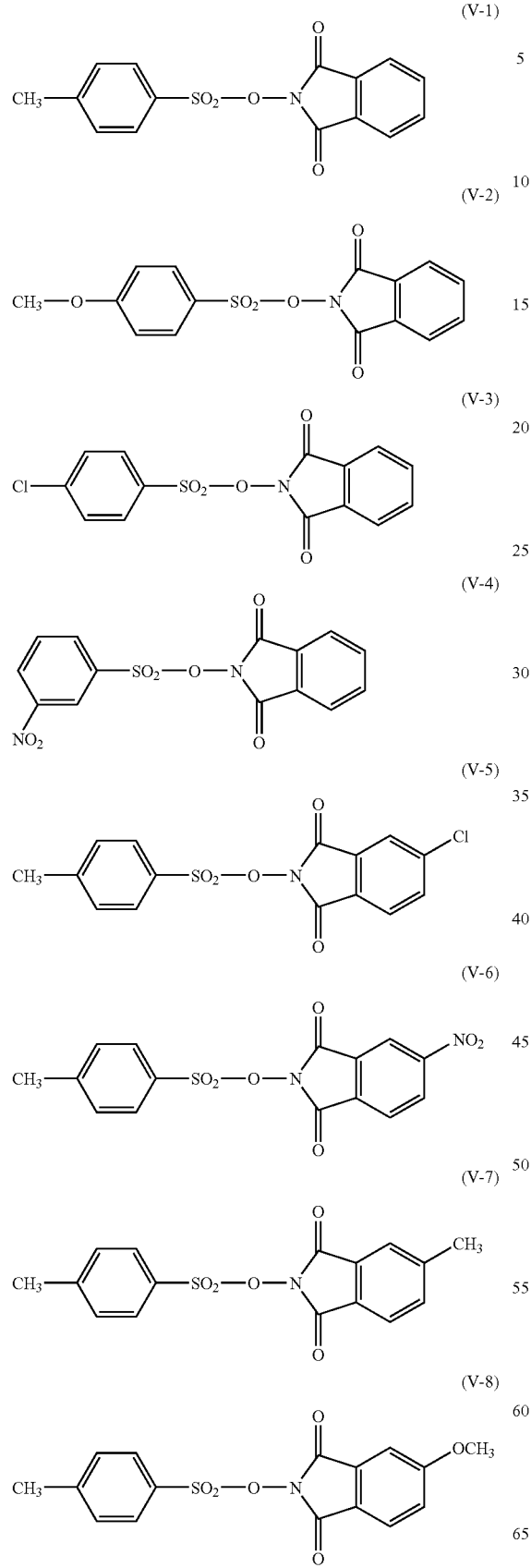
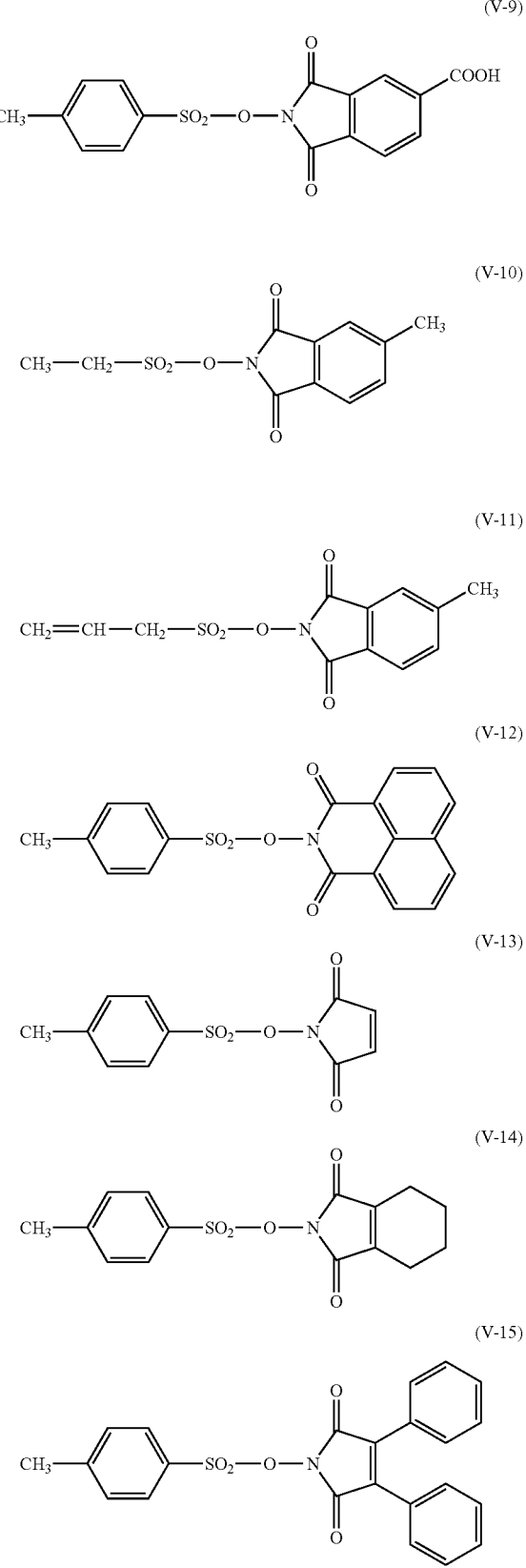

-continued

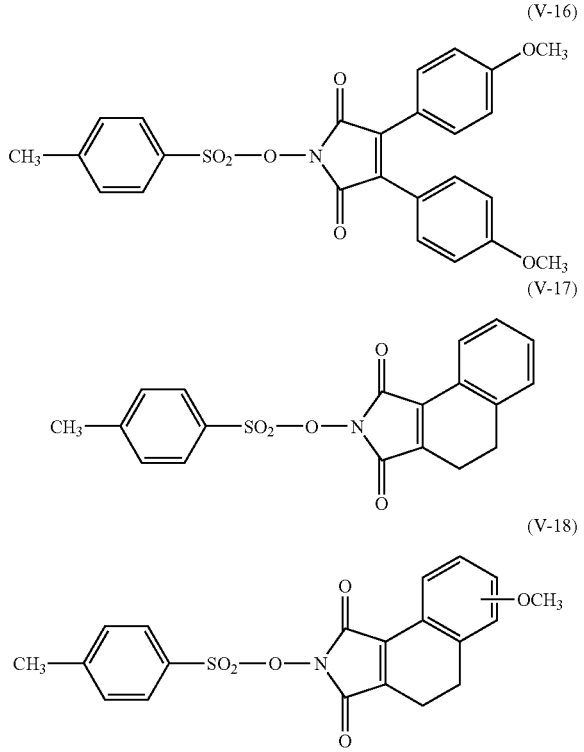

As component (D) a compound capable of decomposing and generating an acid by heating, onium salts having a halide or sulfonic acid as the counter ion, preferably a compound having the structure of any of iodonium salt, sulfonium salt, or diazonium salt represented by the following formula (VI), (VII) or (VIII), can be preferably exemplified.

In the above formulae, $X^-$ represents a halide ion, $ClO_4^-$, $PF_6^-$, $SbF_6^-$, $BF_4^-$ or $R^7$—$SO_3^-$ (wherein $R^7$ represents a hydrocarbon group having 20 or less carbon atoms which may have a substituent); $Ar^3$ and $Ar^4$ each represents an aryl group having 20 or less carbon atoms which may have a substituent; and $R^8$, $R^9$ and $R^{10}$ each represents a hydrocarbon group having 18 or less carbon atoms which may have a substituent.

In the above formulae, $X^-$ particularly preferably represents $R^7$—$SO_3^-$, wherein R represents a hydrocarbon group having 20 or less carbon atoms which may have a substituent. The specific examples of the hydrocarbon groups represented by $R^7$ include an alkyl group (e.g., a methyl group, an ethyl group, an n-propyl group, an i-propyl group, an allyl group, an n-butyl group, a sec-butyl group, a t-butyl group, a hexyl group, a cyclohexyl group, an octyl group, a 2-ethylhexyl group, and a dodecyl group), an alkenyl group, (e.g., a vinyl group, a 1-methylvinyl group and a 2-phe-nylviny group), an aralkyl group, (e.g., a benzyl group and a phenethyl group), and an aryl group, (e.g., a phenyl group, a tolyl group, a xylyl group, a cumenyl group, a mesityl group, a dodecylphenyl group, a phenylphenyl group, a naphthyl group and an anthracenyl group).

These hydrocarbon groups may have a substituent, e.g., a halogen atom, a hydroxyl group, an alkoxyl group, an allyloxy group, a nitro grop, a cyano group, a carbonyl group, a carboxyl group, an alkoxycarbonyl group, an anilino group or an acetamido group. The specific examples of hydrocarbon groups having a substituent include a trifluoromethyl group, a 2-methoxyethyl group, a 10-camphanyl group, a fluorophenyl group, a chlorophenyl group, a bromophenyl group, an iodophenyl group, a methoxyphenyl group, a hydroxyphenyl group, a phenoxyphenyl group, a nitrophenyl group, a cyanophenyl group, a carboxyphenyl group, a methoxynaphthyl group, a dimethoxy-anthracenyl group, a diethoxyanthracenyl group and an anthraquinonyl group.

$Ar^3$ and $Ar^4$ each represents an aryl group having 20 or less carbon atoms which may have a substituent, specifically a phenyl group, a tolyl group, a xylyl group, a cumenyl group, a mesityl group, a dodecylphenyl group, a phenylphenyl group, a naphthyl group, an anthracenyl group, a fluorophenyl group, a chlorophenyl group, a bromophenyl group, an iodophenyl group, a methoxyphenyl group, a hydroxyphenyl group, a phenoxyphenyl group, a nitrophenyl group, a cyanophenyl group, a carboxy-phenyl group, an anilinophenyl group, an anilinocarbonyl-phenyl group, amorpholinophenyl group, aphenylazophenyl group, a methoxynaphthyl group, a hydroxynaphthyl group, a nitronaphthyl group, and an anthraquinonyl group are exemplified.

$R^8$, $R^9$ and $R^{10}$ each represents a hydrocarbon group having 18 or less carbon atoms which may have a substituent, specifically a hydrocarbon group, e.g., a methyl group, an ethyl group, an n-propyl group, an i-propyl group, an allyl group, an n-butyl group, a sec-butyl group, a t-butyl group, a hexyl group, a cyclohexyl group, a benzyl group, a phenyl group, a tolyl group, a t-butylphenyl group, a naphthyl group and an anthracenyl group, and a hydrocarbon group having a substituent, e.g., a 2-methoxyethyl group, a fluorophenyl group, a chlorophenyl group, a bromophenyl group, an iodophenyl group, a methoxyphenyl group, a hydroxyphenyl group, a phenylthiophenyl group, a hydroxynaphthyl group, a methoxynaphthyl group, a benzoylmethyl group, and a naphthoylmethyl group are exemplified.

$R^8$ and $R^9$ may be bonded to each other to form a ring.

As the cationic moieties of onium salts represented by formulae (VI) to (VIII), an iodonium ion, a sulfonium ion and a diazonium ion are exemplified. The specific examples of the structures of cationic moieties of onium salts are shown below, but the present invention is not limited thereto.

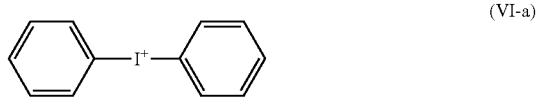
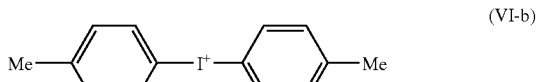

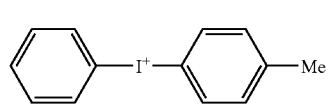
(VI-c)
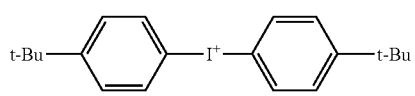
(VI-d)
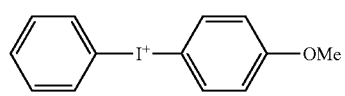
(VI-e)
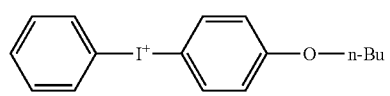
(VI-f)
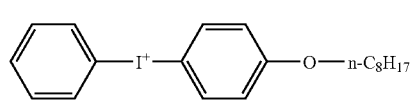
(VI-g)
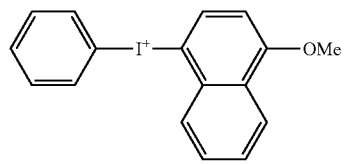
(VI-h)
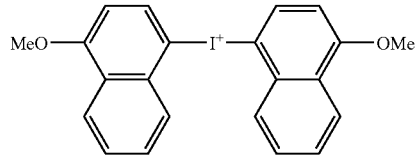
(VI-i)
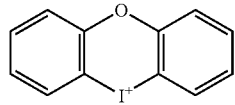
(VI-l)
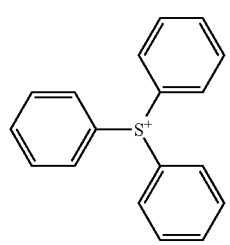
(VII-a)
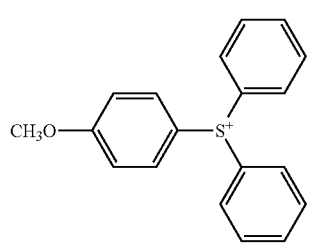
(VII-b)
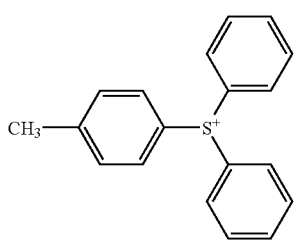
(VII-c)
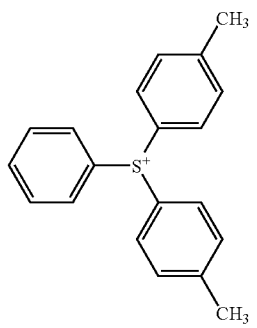
(VII-d)
(VII-e)
(VII-f)
(VII-g)

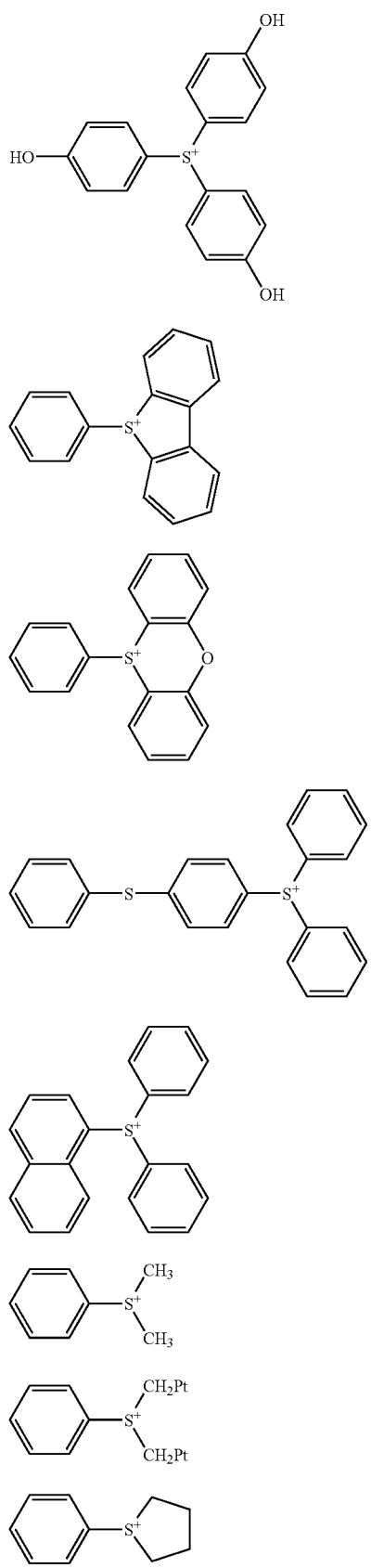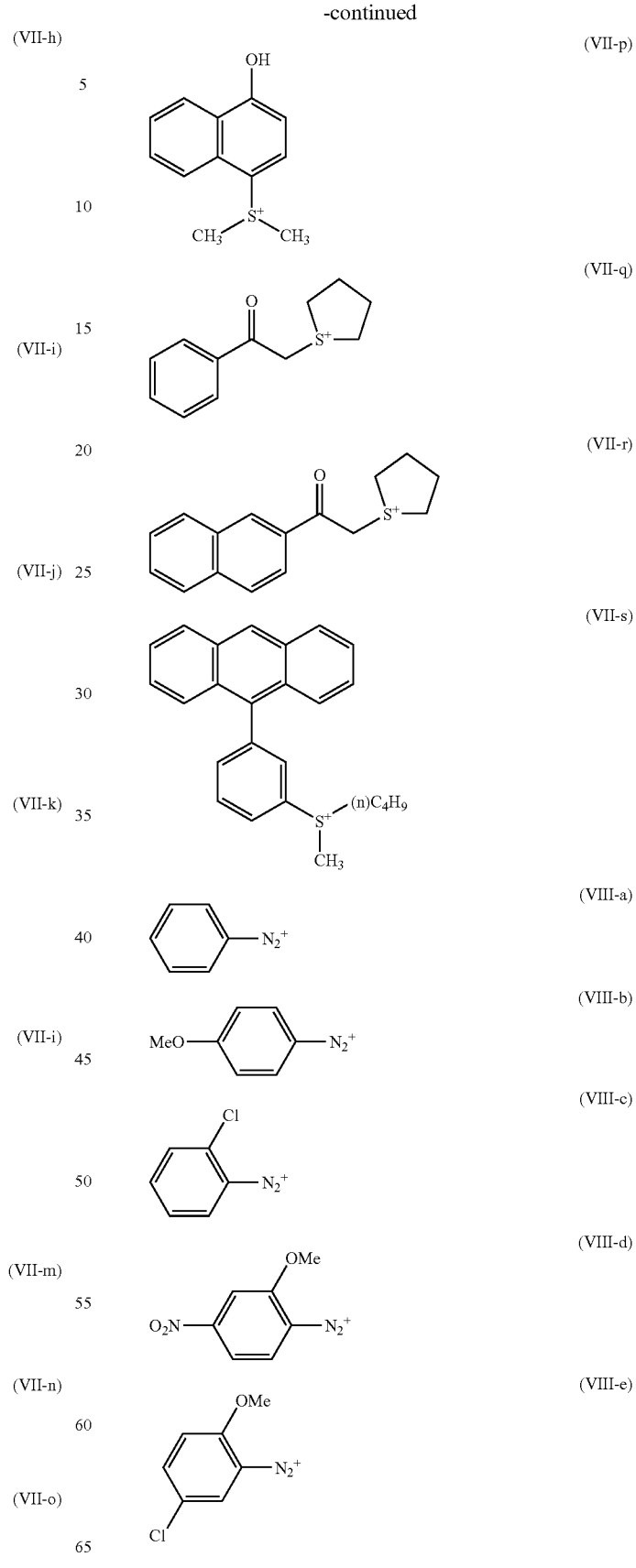

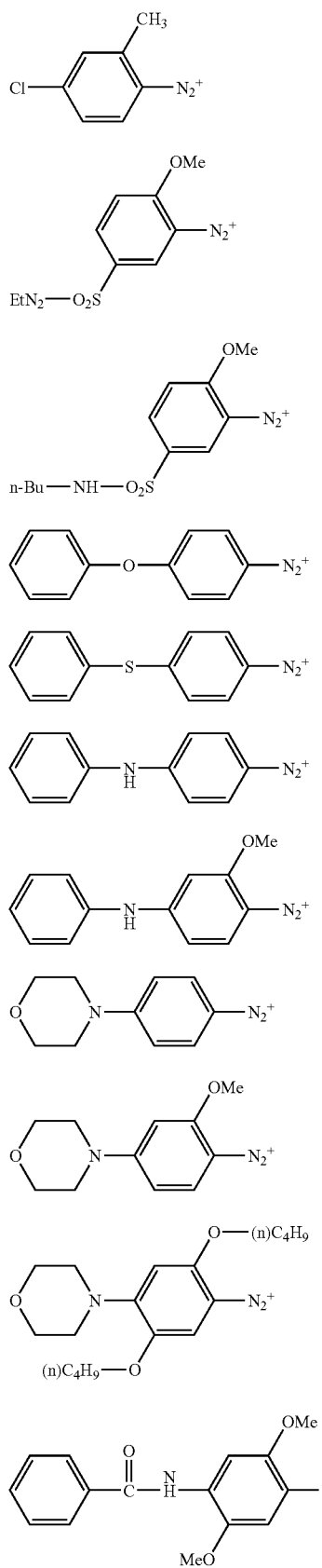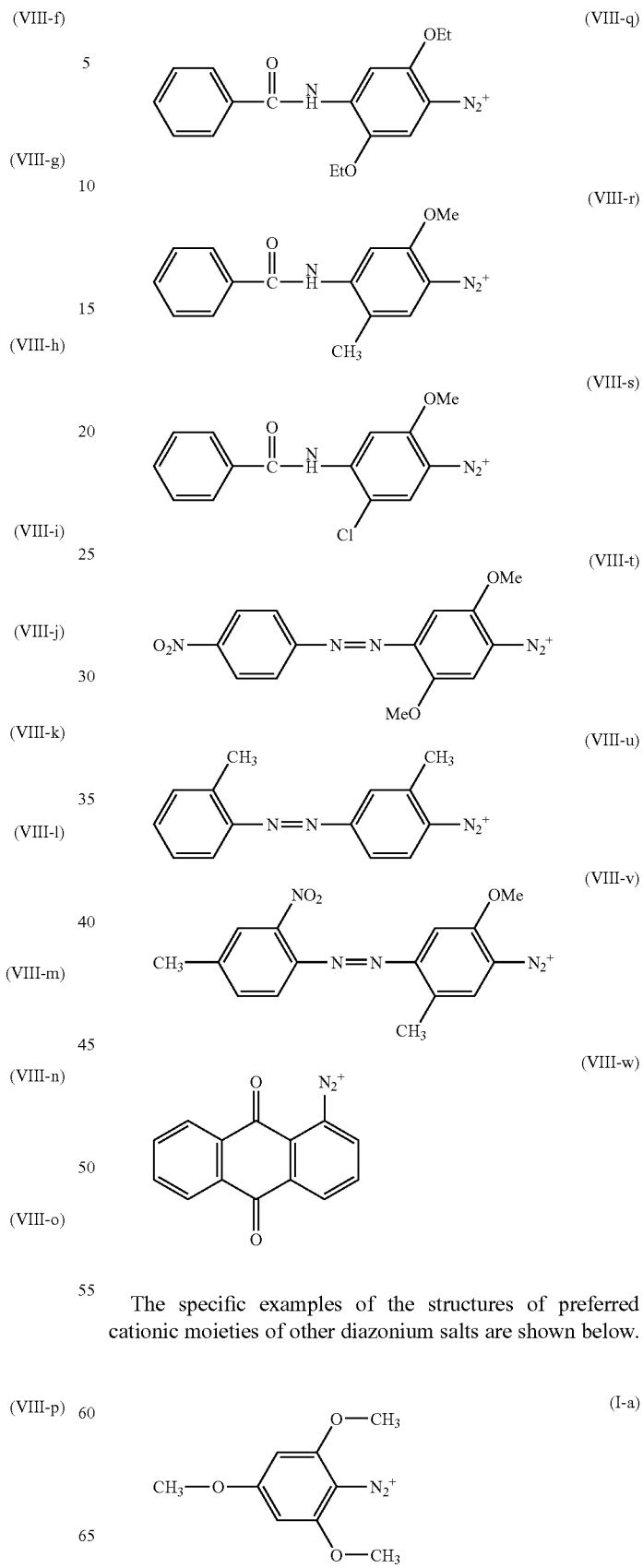
The specific examples of the structures of preferred cationic moieties of other diazonium salts are shown below.

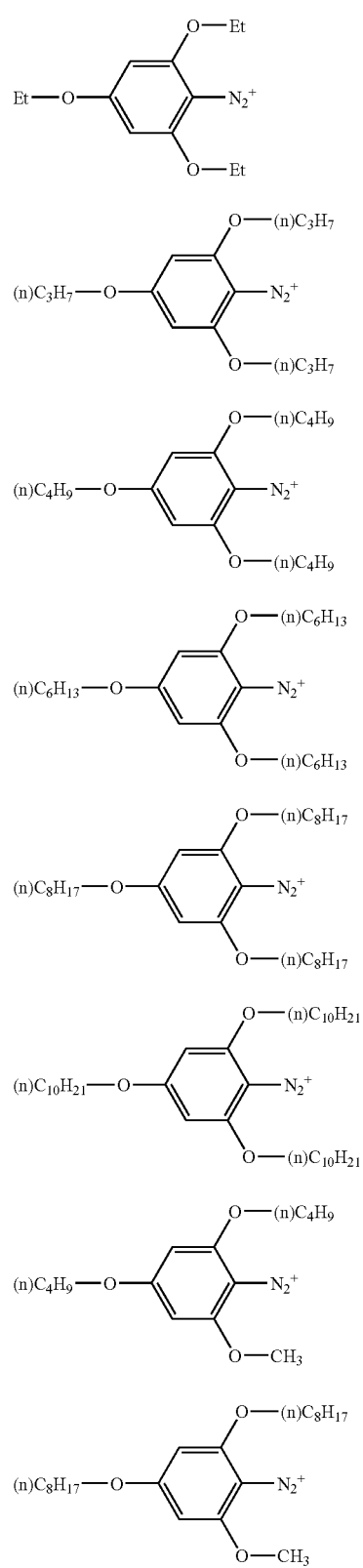
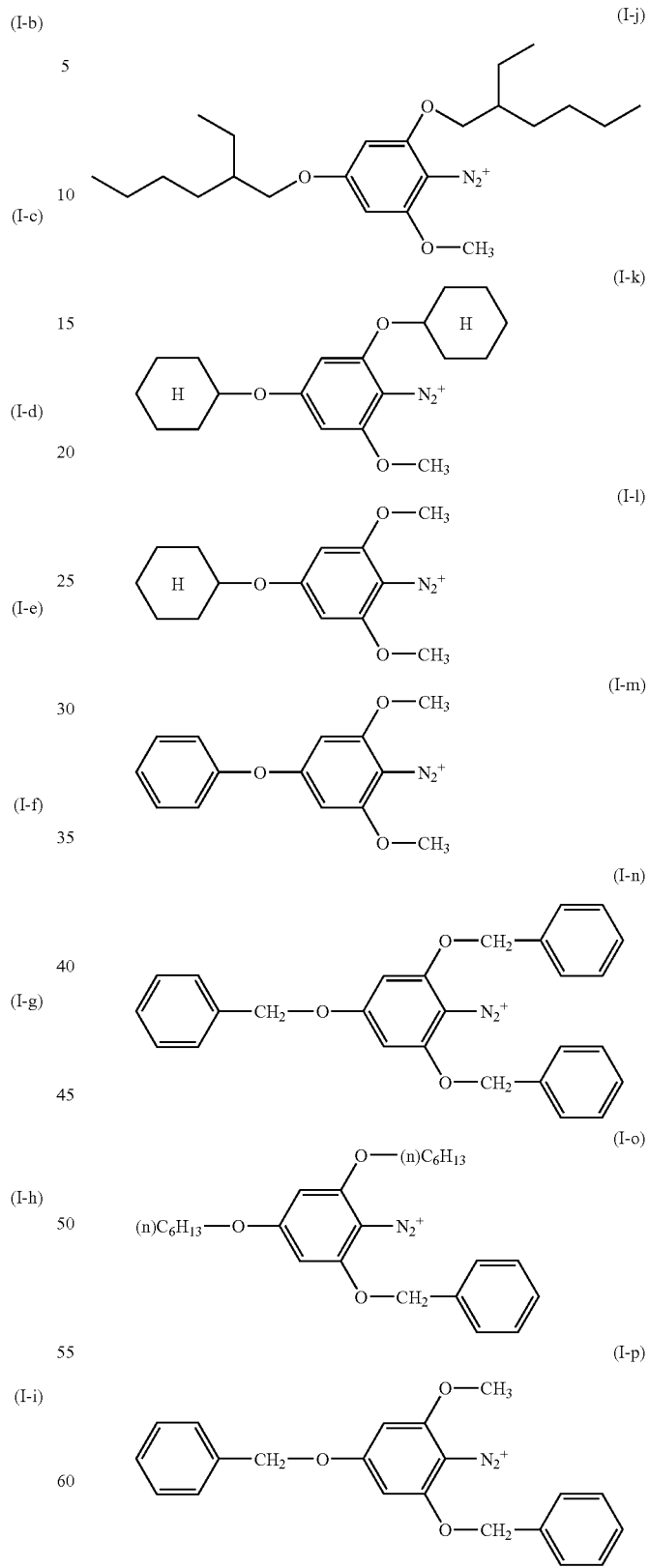

-continued

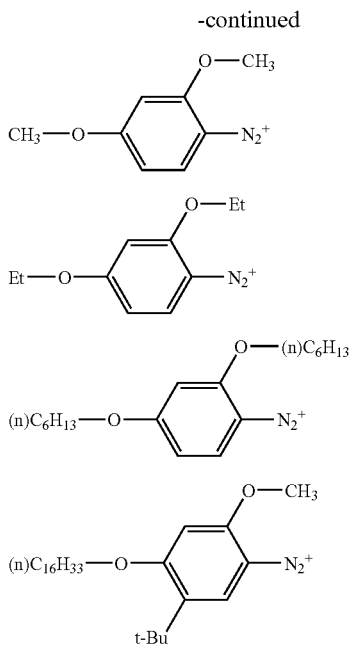

Of these counter anions of onium salts, the examples of particularly preferably used sulfonate ions are shown below.
1) Methanesulfonate
2) Ethanesulfonate
3) 1-Propanesulfonate
4) 2-Propanesulfonate
5) n-Butanesulfonate
6) Allylsulfonate
7) 10-Camphorsulfonate
8) Trifluoromethanesulfonate
9) Benzenefluoroethanesulfonate
10) Benzenesulfonate
11) p-Toluenesulfonate
12) 3-Methoxybenzenesulfonate
13) 4-Methoxybenzenesulfonate
14) 4-Hydroxybenzenesulfonate
15) 4-Chlorobenzenesulfonate
16) 3-Nitrobenzenesulfonate
17) 4-Nitrobenzenesulfonate
18) 4-Acetylbenzenesulfonate
19) Pentafluorobenzenesulfonate
20) 4-Dodecylbenzenesulfonate
21) Mesitylenesulfonate
22) 2,4,6-Triisopropylbenzenesulfonate
23) 2-Hydroxy-4-methoxybenzophenone-5-sulfonate
24) Isophthalic acid dimethyl-5-sulfonate
25) Diphenylamine-4-sulfonate
26) 1-Naphthalenesulfonate
27) 2-Naphthalenesulfonate
28) 2-Naphthol-6-sulfonate
29) 2-Naphthol-7-sulfonate
30) Anthraquinone-1-sulfonate
31) Anthraquinone-2-sulfonate
32) 9,10-Dimethoxyanthracene-2-sulfonate
33) 9,10-Diethoxyanthracene-2-sulfonate
34) Quinoline-8-sulfonate
35) 8-Hydroxyquinoline-5-sulfonate
36) 8-Anilinonaphthalene-1-sulfonate Further, a salt of disulfonate shown below and a 2 equivalent amount of cation of onium salt can also be used.

41) m-Benzenedisulfonate
42) Benzaldehyde-2,4-disulfonate
43) 1,5-Naphthalenedisulfonate
44) 2,6-Naphthalenedisulfonate
45) 2,7-Naphthalenedisulfonate
46) Anthraquinone-1,5-disulfonate
47) Anthraquinone-1,8-disulfonate
48) Anthraquinone-2,6-disulfonate
49) 9,10-Dimethoxyanthracene-2,6-disulfonate
50) 9,10-Diethoxyanthracene-2,6-disulfonate Onium salt sulfonates preferably used in the invention can be obtained by mixing sulfonic acid or sodium sulfonate or potassium salt and corresponding Cl⁻ salt or the like in water or a mixed solvent of water and a hydrophilic solvent, e.g., alcohol, to thereby exchange salts.

Onium compounds can be synthesized according to well known methods, e.g., *Shin Jikken Kagaku Koza*, Vol. 14-I, Chapter 2·3, p. 448, Vol. 14-III, Chapter 8·16, p. 1838, Chapter 7·14, p. 1564, Maruzen Co., J. W. Knapczyk et al., *J. Am. Chem. Soc.*, Vol. 91, 145 (1969), A. L. Maycok et al., *J. Org. Chem.*, Vol. 351, 2532 (1970), J. V. Crivello et al., *Polym. Chem. Ed.*, Vol. 18, 2677 (1980), U.S. Pat. Nos. 2,807,648, 4,247,473, JP-A-53-101331 and JP-B-5-53166 are exemplified.

The preferred examples of onium salt sulfonates which are preferably used in the invention as acid generators are shown below.

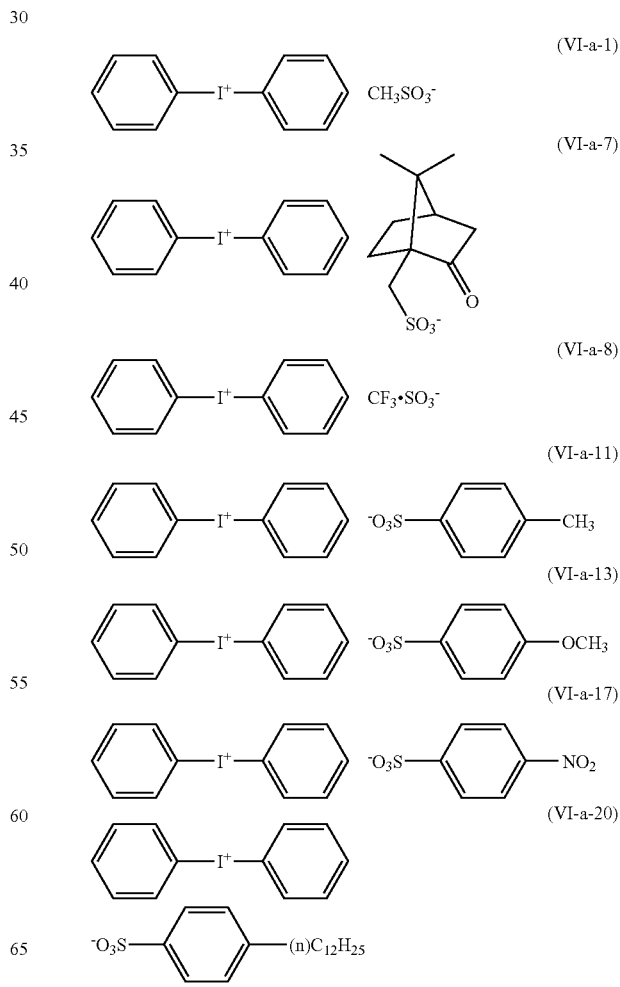

-continued
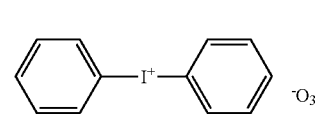
(VI-a-27)
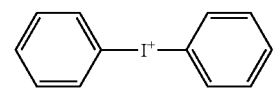
(VI-a-31)
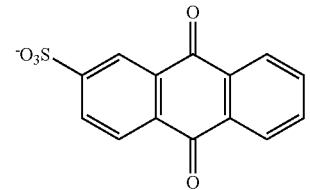
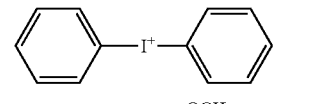
(VI-a-32)
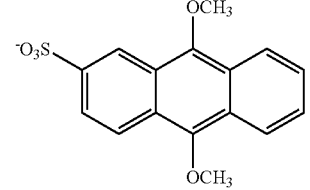
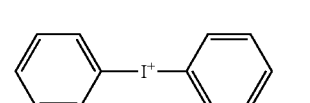
(VI-a-33)
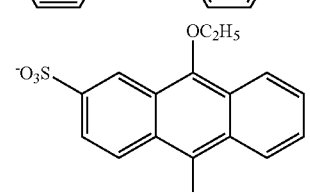
(VI-a-36)
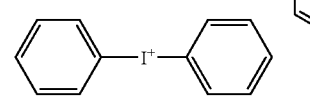
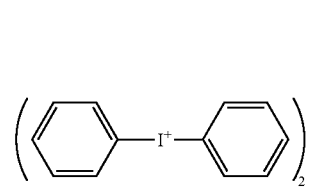
(VI-a-50)
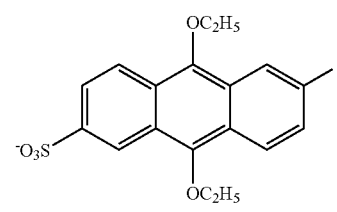
-continued
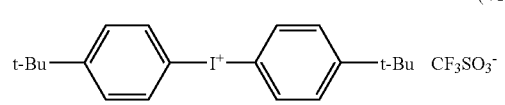
(VI-d-8)
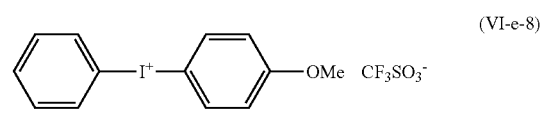
(VI-e-8)
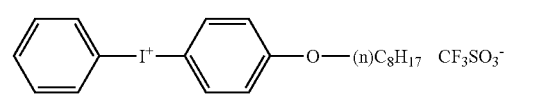
(VI-g-8)
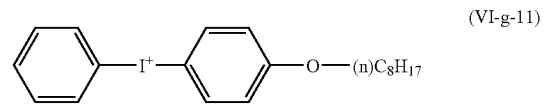
(VI-g-11)
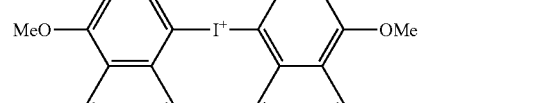
(VI-i-11)
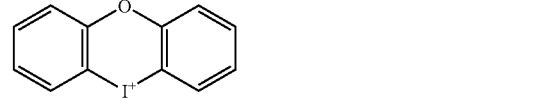
(VI-j-11)
(VII-a-1)
(VII-a-2)

-continued
(VII-a-5)
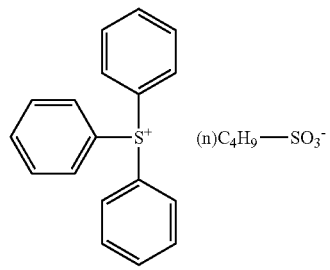
(VII-a-7)
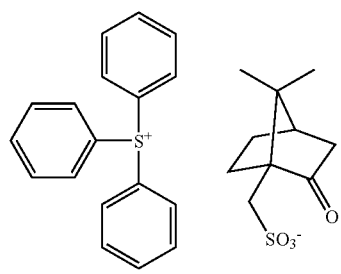
(VII-a-8)
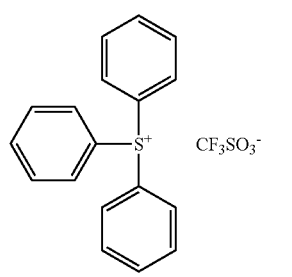
(VII-a-10)
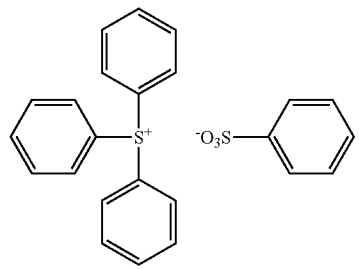
(VII-a-11)
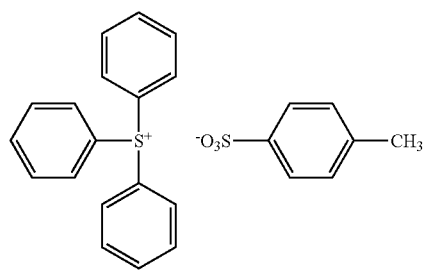
-continued
(VII-a-13)
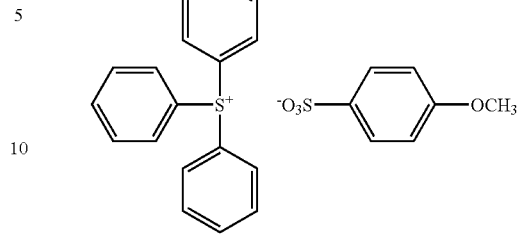
(VII-a-15)
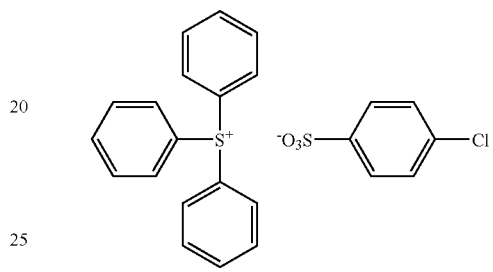
(VII-a-17)
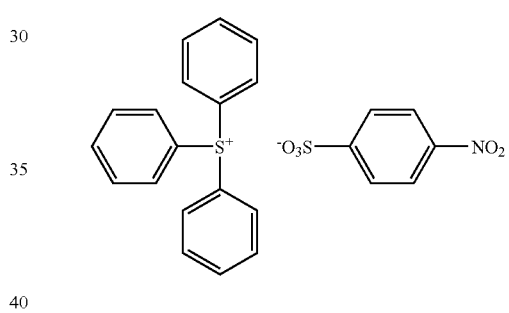
(VII-a-20)
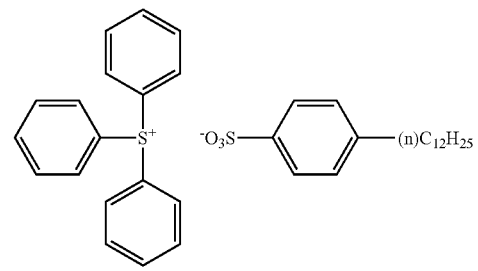
(VII-a-21)
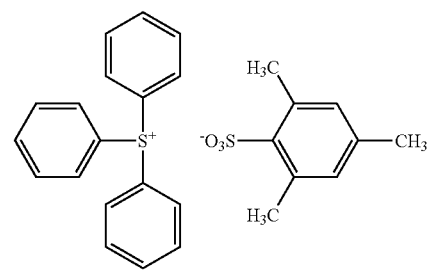

-continued
(VII-a-22)
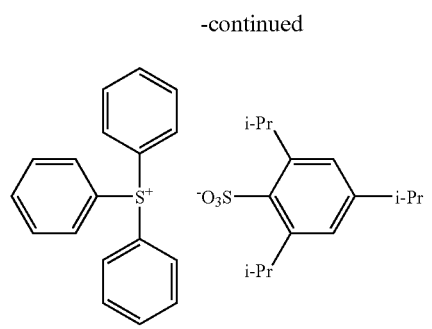
(VII-a-23)
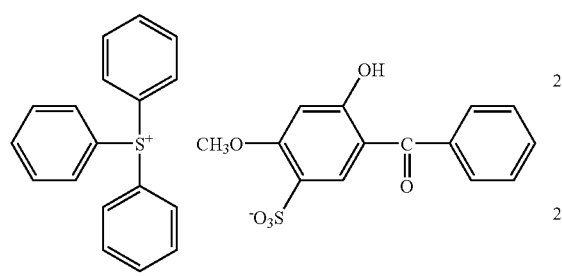
(VII-a-26)
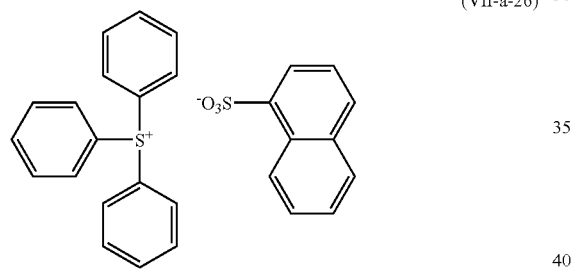
(VII-a-27)
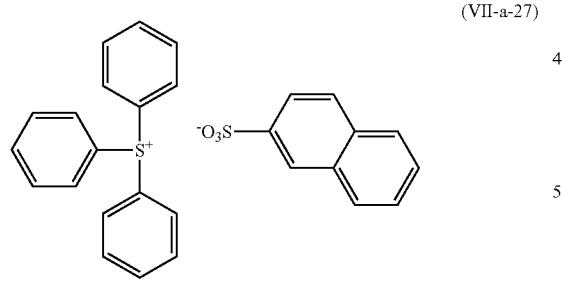
(VII-a-31)
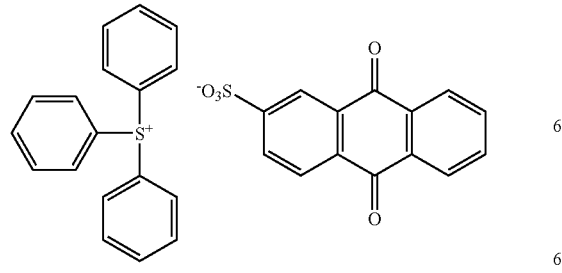
-continued
(VII-a-32)
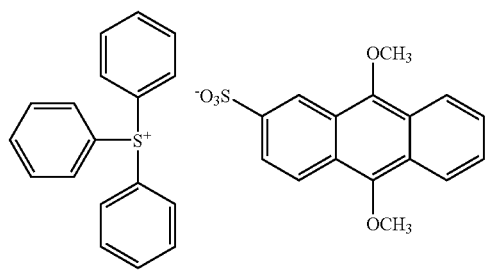
(VII-a-33)
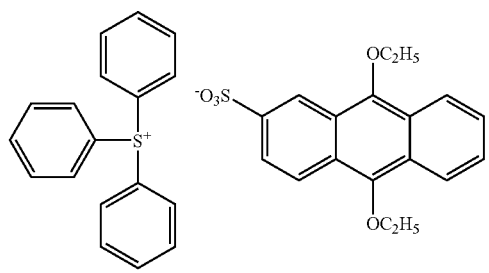
(VII-b-8)
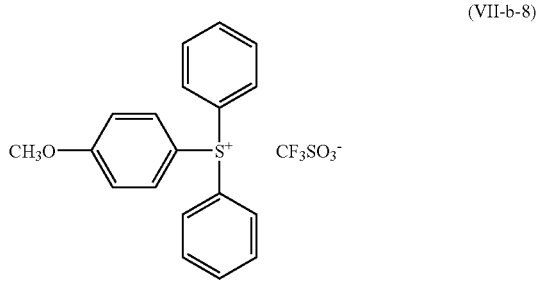
(VII-c-8)
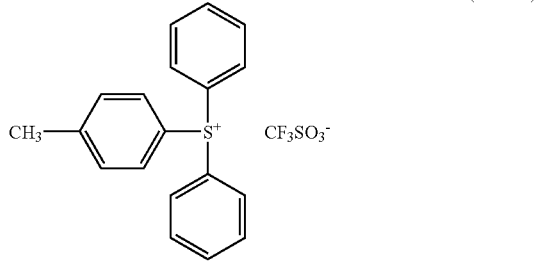
(VII-d-8)
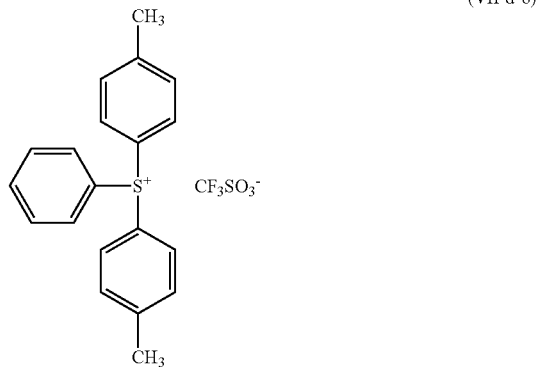

-continued
(VII-e-8)
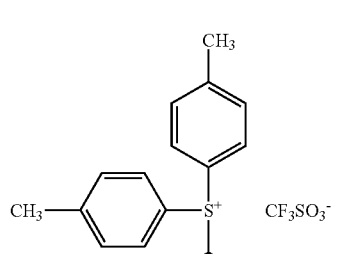
(VII-f-8)
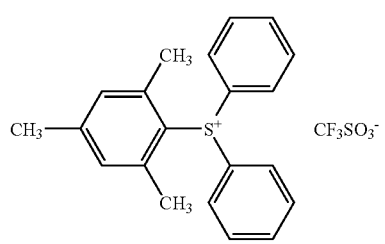
(VII-g-8)
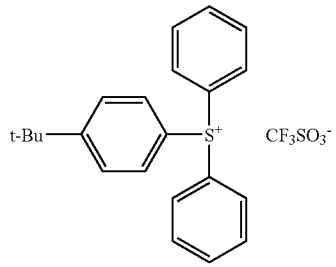
(VII-h-8)
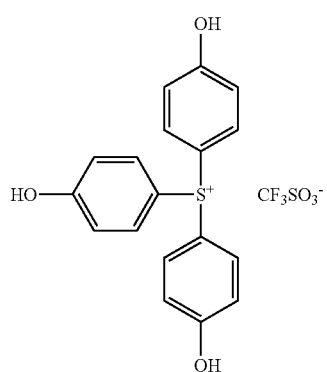
(VII-j-11)
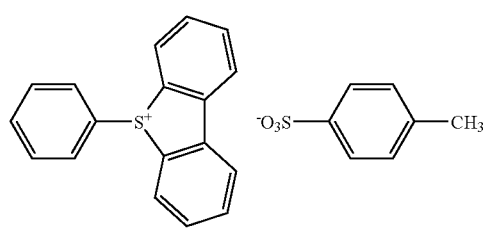
-continued
(VII-k-8)
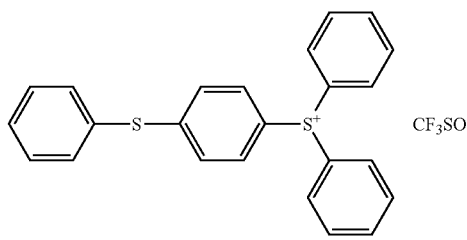
(VII-k-13)
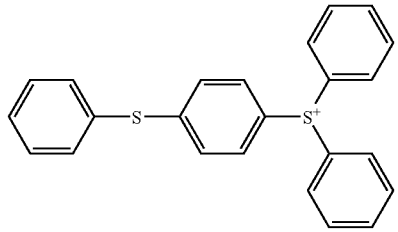
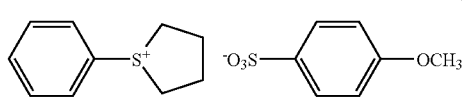
(VII-o-11)
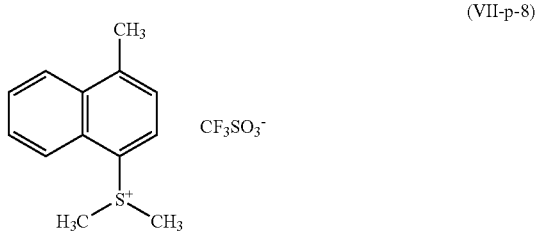
(VII-p-8)
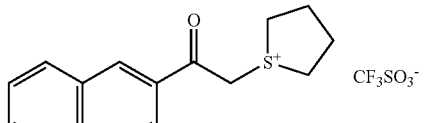
(VII-r-8)
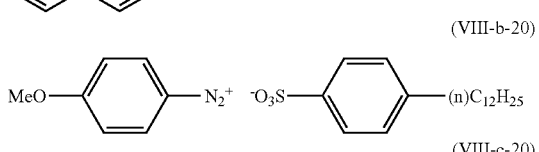
(VIII-b-20)
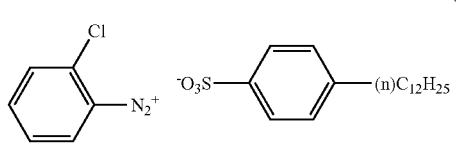
(VIII-c-20)
(VIII-d-21)
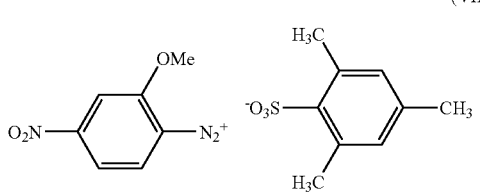

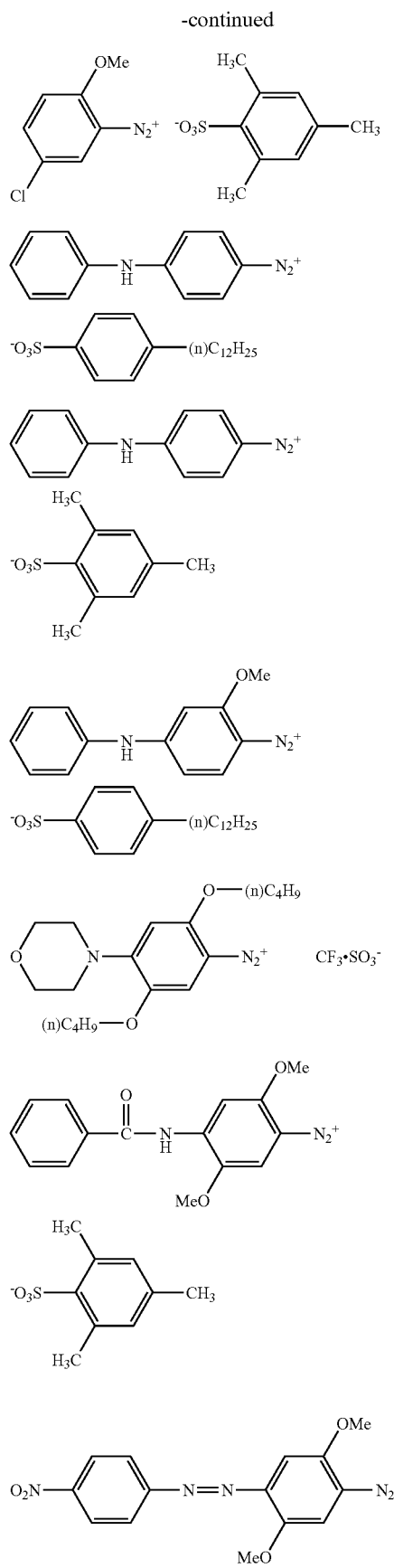

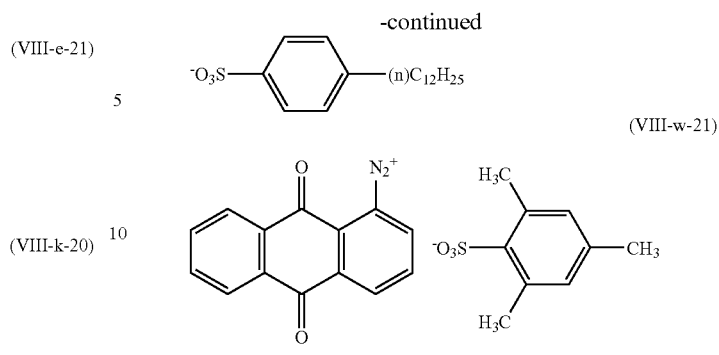

These acid generators are used in an amount of from 0.01 to 50 mass %, preferably from 0.1 to 25 mass %, and more preferably from 0.5 to 20 mass %, based on the total solid contents in the intermediate layer composition.

These compounds may be used alone or two or more compounds may be used in combination.

(5) Radical Polymerizable Compound (E) For Use in the Intermediate Layer Composition of the Invention:

The radical polymerizable compounds used in the intermediate layer composition of the invention are radical polymerizable compounds having at least one ethylenic unsaturated double bond selected from the compounds having at least one terminal ethylenic unsaturated bond, preferably two or more, and chain polymerization reaction is caused by radicals generated from a radical generator and hardened. These compounds are well known in the industry and can be used without limitation. Radical polymerizable compounds take chemical forms of a monomer, a prepolymer, i.e., a dimer, a trimer, an oligomer, and the mixtures and copolymers of them. The examples of monomers and the copolymers of them include unsaturated carboxylic acids (e.g., acrylic acid, methacrylic acid, itaconic acid, crotonic acid, isocrotonic acid and maleic acid), and esters and amides of them, preferably esters of unsaturated carboxylic acids and aliphatic polyhydric alcohols and amides of unsaturated carboxylic acids and aliphatic polyvalent amines are used. Addition reaction products of unsaturated carboxylic esters and amides having a nucleophilic substituent, e.g., a hydroxyl group, an amino group or a mercapto group, with monofunctional or polyfunctional isocyanates or epoxies, and dehydrated condensation reaction products of these unsaturated carboxylic esters and amides with monofunctional or polyfunctional carboxylic acids are also preferably used. Addition reaction products of unsaturated carboxylic esters and amides having an electrophilic substituent, e.g., an isocyanate group or an epoxy group, with monofunctional or polyfunctional alcohols, amines and thiols, and substitution reaction products of unsaturated carboxylic esters and amides having a separable substituent, e.g., a halogen group or a tosyloxy group, with mono functional or poly functional alcohols, amines and thiols are also preferably used. As other examples, compounds in which the above saturated carboxylic acids are substituted with saturated sulfonic acid or styrene can also be used.

The specific examples of acrylic ester, methacrylic ester, itaconic ester, crotonic ester, isocrotonic ester, and maleic ester which are radical polymerizable compounds and are the esters of aliphatic polyhydric alcohol compounds and unsaturated carboxylic acids, are disclosed in JP-A-2001-133969, paragraphs [0037] to [0042], and these compounds are also applicable to the present invention.

As the examples of other esters, aliphatic alcohol esters as disclosed in JP-B-46-27926, JP-B-51-47334 and JP-A-57-196231, esters having an aromatic skeleton as disclosed in JP-A-59-5240, JP-A-59-5241 and JP-A-2-226149, and esters having an amino group as disclosed in JP-A-1-165613 are also preferably used.

Urethane addition polymerizable compounds manufactured by an addition reaction of isocyanate and a hydroxyl group are also preferred, and as the specific examples of such compounds, vinyl urethane compounds containing two or more polymerizable vinyl groups in one molecule obtained by adding a vinyl monomer having a hydroxyl group represented by the following formula (IV') to a polyisocyanate compound having two or more isocyanate groups in one molecule as disclosed in JP-B-48-41708 are exemplified.

$$CH_2=C(R^{41})COOCH_2CH(R^{42})OH \quad (IV')$$

wherein $R^{41}$ and $R^{42}$ represent H or $CH_3$.

With respect to these radical polymerizable compounds, the details of using method e.g., what a structure should be used, whether the compound is used alone or in combination, and how much amount is to be used, can be arbitrarily determined according to the final design of performances of the material of intermediate layer, for example, the selections are done from the following viewpoints. Describing as to hardening velocity, the structure having higher content of unsaturated groups per a molecule is preferred, and in many cases 2-functional or more is preferred. For raising the hardened film strength, 3-functional or more is preferred. Further, by using compounds having different functional numbers and different polymerizable groups in combination (e.g., acrylic ester compound, methacrylic ester compound, styrene compounds), both hardening velocity and film strength can be controlled.

The preferred blending ratio of radical polymerizable compounds is from 5 to 80 mass % based on the total components of the composition, preferably from 20 to 75 mass %. These compounds may be used alone or in combination of two or more.

The specific examples of radical polymerizable compounds which are esters of aliphatic polyhydric alcohols and unsaturated carboxylic acids include, as acrylic esters, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylopropane tri-(acryloyloxypropyl) ether, trimethyolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and polyester acrylate oligomer.

The specific examples of radical polymerizable compounds include, as methacrylic esters, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate sorbitol trimethacrylate, sorbitol tetramethacrylate, bis[p-(3-methacryloxy-2-hydroxypropoxy)phenyl]dimethylmethane, and bis[p-(methacryloxyethoxy)phenyl] dimethylmethane As itaconic esters, ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate are exemplified.

As crotonic esters, ethylene glycol dicrotonate, tetramethylene glycol dicrotonate, pentaerythritol dicrotonate, and sorbitol tetradicrotonate are exemplified.

As isocrotonic esters, ethylene glycol diisocrotonate, pentaerythritol diisocrotonate and sorbitol tetraiso-crotonate are exemplified.

As maleic esters, ethylene glycol dimaleate, triethylene glycol dimaleate, pentaerythritol dimaleate and sorbitol tetramaleate are exemplified.

As the specific examples of amide monomers of aliphatic polyvalent amines and unsaturated carboxylic acids, methylenebis-acrylamide, methylenebis-methacrylamide, 1,6-hexamethylenebis-acrylamide, 1,6-hexamethylenebis-methacrylamide, diethylenetriaminetriacrylamide, xylylenebis-acrylamide, and xylylenebis-methacrylamide are exemplified.

As other preferred amide monomers, those having a cyclohexylene structure disclosed in JP-B-54-21726 are exemplified.

Urethane acrylates as disclosed in JP-A-51-37193, JP-B-2-32293 and JP-B-2-16765, and urethane compounds having an ethylene oxide skeleton as disclosed in JP-B-58-49860, JP-B-56-17654, JP-B-62-39417 and JP-B-62-39418 are also preferably used.

Further, radical polymerizable compounds having an amino structure and sulfide structure in the molecule disclosed in JP-A-63-277653, JP-A-63-260909 and JP-A-1-105238 may be also used.

As other examples, polyfunctional acrylate and methacrylate, e.g., polyester acrylates, and epoxy acrylates obtained by the reaction of epoxy resins and (meth)acrylic acids as disclosed in JP-A-48-64183, JP-B-49-43191and JP-B-52-30490 are exemplified. Specific unsaturated compounds as disclosed in JP-B-46-43946, JP-B-1-40337 and JP-B-1-40336, and vinylphosphonic acid compounds as disclosed in JP-B-1-40336 are also exemplified. In some cases, the structures having a perfluoroalkyl group are preferably used. The compounds introduced as photo-curable monomers and oligomers in *Nippon Setchaku Kyokaishi* (*Bulletin of Adhesion Association Japan*), Vol. 20, No. 7, pp. from 300 to 308 (1984) can also be used.

As the epoxy compounds, preferably glycerol polyglycidyl ether, polyethylene glycol diglycidyl ether, polypropylene diglycidyl ether, trimethylolpropane polyglycidyl ether, sorbitol polyglycidyl ether, and bisphenols or polyphenols or hydrogenated products of polyglycidyl ether thereof are exemplified.

As the compounds having isocyanate, tolylene diisocyanate, diphenylmethane diisocyanate, polymethylene-polyphenyl polyisocyanate, xylylene diisocyanate, naphthalene diisocyanate, cyclohexanephenylene diisocyanate, isophorone diisocyanate, hexamethylene diisocyanate, cyclohexylyl diisocyanate, or compounds obtained by blocking these compounds with alcohols or amines are exemplified as preferred compounds. As the amine compounds, ethylenediamine, diethylenetriamine, triethylenetetramine, hexamethylenediamine, dipropylenediamine and polyethyleneimine are preferred.

The compounds having a hydroxyl group preferably include compounds having methylol at terminals, polyhydric alcohols, e.g., pentaerythritol, bisphenols and polyphenols.

As the compounds having a carboxyl group, preferably aromatic polyvalent carboxylic acids, e.g., pyromellitic acid, trimellitic acid and phthalic acid, and aliphatic polyvalent carboxylicacids, e.g., aidpic acid are preferably exemplified.

As acid anhydrides, preferably pyromellitic anhydride and benzophenonetetracarboxylic anhydride are exemplified.

An intermediate layer is formed of an intermediate layer composition, and it is preferred so as not to bring about intermix when an upper layer resist is coated by hardening an intermediate layer. The constitutional components B to E of the invention have an effect of accelerating the hardening of an intermediate layer composition. A radical initiator of component B and a radical polymerizable compound of component E are used with a polymer of component A to cause polymerization by radical reaction or crosslinking reaction, thereby the hardening of an intermediate layer is accelerated. Further, the hardening of an intermediate layer can be accelerated by the action of an acid generated from component D on a crosslinking agent of component C.

(6) Organic Solvent (Component F) For Use in the Intermediate Layer Composition of the Invention:

As the organic solvents usable in the intermediate layer composition of the present invention, ethylene dichloride, cyclohexanone, cyclopentanone, 2-heptanone, γ-butyrolactone, methyl ethyl ketone, ethyene glycol monomethyl ether, ethyene glycol monoethyl ether, 2-methoxyethyl acetate, ethyene glycol monoethyl ether acetate, propylene glycol monomethyl ether, propylene glycol monomethyl ether acetate, toluene, xylene, chlorobenzene, hexane, ethyl acetate, propyl acetate, butyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran are exemplified.

These organic solvents are used alone or in combination. The selection of organic solvents is important, since they influence the solubility of the composition of the invention, the coating property on a substrate and the preservation stability. The water content in organic solvents is preferably less, since the water content affects various performances.

Of these organic solvents, cyclohexanone, 2-heptanone, propylene glycol monomethyl ether acetate, methyl methoxypropionate and butyl acetate are particularly preferred from the viewpoint of solubility and coating property.

(7) Surfactant For Use in the Intermediate Layer Composition of the Invention:

It is preferred for the intermediate layer composition of the invention to contain any one or two or more of fluorine and/or silicon surfactants (component G) (a fluorine surfactant and a silicon surfactant, a surfactant containing a fluorine atom and a silicon atom).

By containing surfactant (G) in the intermediate layer composition of the invention, unevenness in the film thickness in the in-plane of a wafer can be reduced and a uniform film can be obtained without forming voids.

As component G, the surfactants disclosed in the following patents can be used: JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720 5,360,692, 5,529,881, 5,296,330, 5,436,098, 5,576,143, 5,294,511 and 5,824,451. The following commercially available surfactants can also be used as they are.

As the fluorine and silicon surfactants usable in the invention, Eftop EF301 and EF303 (manufactured by Shin-Akita Kasei Co., Ltd.), Fluorad FC430and 431 (manufactured by Sumitomo 3M Limited), Megafac F171, F173, F176, F189and R08 manufactured by Dainippon Ink and Chemicals Inc.), Sarfron S-382, SC101, 102, 103, 104, 105 and 106 (manufactured by ASAHI GLASS CO., LTD.), and Troy Sol S-366 (Troy Chemical Co., Ltd.) are exemplified. In addition, polysiloxane polymer KP-341 (manufactured by Shin-Etsu Chemical Co., Ltd.) can also be used as a silicon surfactant.

Besides the foregoing well-known surfactants, surfactants using polymers having a fluoro-aliphatic group derived from a fluoro-aliphatic compound manufactured by a telomerization method (also called a telomer method) or an oligomerization method (also called an oligomer method) can be used. Fluoro-aliphatic compounds can be synthesized according to the method disclosed in JP-A-2002-90991.

As the polymers having a fluoro-aliphatic group, copolymers of monomers having a fluoro-aliphatic group and (poly(oxyalkylene)) acrylate and/or (poly(oxyalkylene)) methacrylate are preferred, and they may be irregularly distributed or may be block copolymerized. As poly(oxyalkylene) groups, a poly(oxyethylene) group, a poly(oxypropylene) group and apoly (oxybutylene) group are exemplified. Further, block combination of poly(oxyethylene, oxypropylene and oxyethylene), and units having alkylene having different chain length in the same chain length, e.g., a group of block combination of poly(oxyethylene and oxypropylene) may also be used. Copolymers of monomers having a fluoro-aliphatic group and (poly(oxyalkylene)) acrylate (or methacrylate) may be ternary or more copolymers comprising monomers having two or more different kinds of fluoro-aliphatic groups, and two or more different kinds of (poly(oxyalkylene)) acrylates (or methacrylates) copolymerized at the same time, not only binary copolymers.

For example, as commercially available products of such surfactants, Megafac F178, F470, F473, F475, F476 and F472 (manufactured by Dainippon Ink and Chemicals Inc.) can be exemplified. Further, copolymers of acrylate (or methacrylate) having a $C_6F_{13}$ group and (poly(oxyalkylene)) acrylate (or methacrylate), copolymers of acrylate (or methacrylate) having a $C_6F_{13}$ group, (poly(oxyethylene)) acrylate (ormethacrylate), and (poly(oxypropylene)) acrylate (or methacrylate), copolymers of acrylate (or methacrylate) having a $C_8F_{17}$ group and (poly(oxyethylene)) acrylate (or methacrylate), copolymers of acrylate (or methacrylate) having a $C_8F_{17}$ group, (poly(oxyethylene)) acrylate (or methacrylate), and poly(oxypropylene) acrylate (or methacrylate) are exemplified.

The use amount of surfactants is preferably from 0.0001 to 2 mass % based on the total amount of the intermediate layer composition (excluding solvents), and more preferably from 0.001 to 1 mass %.

In the present invention, surfactants other than the above-described fluorine and/or silicon surfactants can also be used in combination. The specific examples of such other surfactants include nonionic surfactants, such as polyoxy-ethylene alkyl ethers, e.g., polyoxyethylene lauryl ether, polyoxyethylene stearyl ether, polyoxyethylene cetyl ether, and polyoxyethylene oleyl ether; polyoxyethylene alkylallyl ethers, e.g., polyoxyethylene octylphenol ether and polyoxyethylene nonylphenol ether; polyoxyethylene-polyoxypropylene block copolymers; sorbitan fatty acid esters, e.g., sorbitan monolaurate, sorbitan monopalmitate, sorbitan monostearate, sorbitan monooleate, sorbitan trioleate, and sorbitan tristearate; and polyoxyethylene sorbitan fatty acid esters, e.g., polyoxyethylene sorbitan monolaurate, polyoxy-ethylene sorbitan monopalmitate, polyoxyethylene sorbitan monostearate, polyoxyethylene sorbitan trioleate, and polyoxyethylene sorbitan tristearate.

These surfactants may be used alone or some of these surfactants may be used in combination.

It is preferred that the metal impurities and impurities such as chlorine ions in the intermediate layer composition of the invention to be reduced to 100 ppb or less from the viewpoint of preventing malfunctioning and imperfection in the manufacture of semiconductor device and increasing yield.

The solid contents in the intermediate layer composition are preferably dissolved in an organic solvent in solid concentration of from 1 to 40 mass %, more preferably from 2 to 30 mass %, and still more preferably from 3 to 20 mass %.

It is preferred that the intermediate layer composition of the invention after being dissolved in an organic solvent is filtered through a filter having a pore diameter of generally from 0.05 to 0.2 μm for the purpose of removing impurities.

Plasticizers, dyes and spectral sensitizers may further be added to the intermediate layer composition of the invention, if necessary.

As the plasticizers usable in the invention, the compounds disclosed in JP-A-4-212960, JP-A-8-262720, EP-735422, EP-416873, EP-439371 and U.S. Pat. No. 5,846,690, specifically di(2-ethylhexyl)adipate, n-hexyl benzoate, di-n-octyl phthalate, di-n-butyl phthalate, benzyl-n-butyl phthalate and dihydroabietyl phthalate are exemplified.

As the dyes for the intermediate layer composition, oil dyes and basic dyes are preferably usable in the invention. Specifically, Oil Yellow #101, Oil Yellow #103, Oil Pink #312, Oil Green BG, Oil Blue BOS, Oil Blue #603, Oil Black BY, Oil Black BS and Oil Black T-505 (manufactured by Orient Chemical Industries, Ltd.), Crystal Violet (C.I. 142555), Methyl Violet (C.I. 142535), RhodamineB (C.I. 145170B), Malachite Green (C.I. 142000), and Methylene Blue (C.I. 52015) are exemplified.

Moreover, the following shown spectral sensitizers can be added to the intermediate layer composition of the invention. Specifically, benzophenone, p,p'-tetramethyldiaminobenzophenone, p,p'-tetraethylethylaminobenzophenone, 2-chlorothioxane, anthrone, 9-ethoxyanthracene, anthracene, pyrene, perylene, phenothiazine, benzyl, Acridine Orange, benzoflavin, cetoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthra-quinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonyl-coumarin) and coronene are exemplified, but the present invention is not limited thereto.

These spectral sensitizers can also be used as the light absorbers of far ultraviolet rays of light sources. In such a case, light absorbers can reduce the standing wave by reducing the reflected light from the substrate to thereby lowering the influence of multipath reflection in the film.

As the lower layer resist of three-layer resist process, appropriate organic polymer films are used, but various kinds of well-known photo-resists may be used. Various series, for instance, FH series and FHi series (manufactured by Fuji Photo Film Co., Ltd.) and PFI series (manufactured by Sumitomo Chemical Co., Ltd.) are exemplified as photoresists.

The laminate of the invention comprises a substrate and a lower resist layer formed on the substrate. A lower resist layer is formed by dissolving lower resist layer components in an appropriate solvent and coating the resulting coating solution by spin coating or spray coating. The thickness of the lower resist layer is preferably from 0.1 to 4.0 μm, more preferably from 0.2 to 2.0 μm, and particularly preferably from 0.25 to 1.5 μm. It is preferred for the lower resist layer to have a thickness of 0.1 μm or more to prevent reflection and ensure dry etching resistance, and when the layer thickness is 4.0 μm or less, a desired aspect ratio can be obtained and the formed micro patterns can be prevented from collapsing.

In the next place, an intermediate layer is formed, but it is preferred to subject the lower resist layer to heat treatment prior to the formation of an intermediate layer. The temperature of heat treatment is preferably from 150 to 250° C., more preferably from 170 to 240° C., and particularly preferably from 180 to 230° C. The temperature of 150° C. or higher is preferred from the point of easily controlling intermixing with an intermediate resist layer, and 250° C. or higher temperature is preferred for being capable of easily controlling the decomposition of the polymer in the lower resist layer. The heat treatment can be performed by means of a hot plate or an oven.

The time of heat treatment varies according to the heat treatment temperature, but in the case where the heat treatment temperature is from 180 to 230° C., it is preferred to set the temperature at 10 to 1,000 seconds, more preferably from 20 to 600 seconds. Heat treatment of 10 seconds or more is preferred for capable of easily controlling intermixing with an intermediate layer by the heat curing effect, and the time of 1,000 seconds or less is preferred in the light of the processing number of the substrates.

In the next place, an intermediate layer is formed on the lower resist layer. An intermediate layer can be formed in the same manner as the formation of the lower resist layer. The layer thickness of the intermediate layer is preferably from 0.02 to 0.6 μm, more preferably from 0.03 to 0.5 μm, and particularly preferably from 0.04 to 0.40 μm. When the thickness is 0.02 μm or more, good transferring property of a resist pattern to the lower resist layer can be secured and the generation of pinholes of the film can be restrained, and the thickness of 0.6 μm or less contributes to the lessening of dimensional shift by etching.

Subsequently, an upper resist layer is formed, but it is preferred to subject the intermediate layer to heat treatment prior to the formation of an upper resist layer. The temperature of heat treatment is preferably from 150 to 250° C., more preferably from 170 to 250° C., and particularly preferably from 180 to 240° C. The temperature of 150° C. or higher is preferred from the point of easily controlling intermixing with the intermediate resist layer and being capable of easily controlling the decomposition of the polymer in the lower resist layer. The heat treatment can be performed by means of a hot plate or an oven.

The time of heat treatment varies according to the heat treatment temperature, but in the case where the heat treatment temperature is from 180 to 230° C., it is preferred to set the temperature at 10 to 1,000 seconds, more preferably from 20 to 600 seconds. Heat treatment of 10 seconds or more is preferred for capable of easily controlling intermixing with the intermediate layer by the heat curing effect, and the time of 1,000 seconds or less is preferred in the light of the processing number of the substrates.

In the next place, an upper resist layer is formed on the intermediate layer. An upper resist layer can be formed in the same manner as the formation of the lower resist layer. The layer thickness of the upper resist layer is preferably from 0.03 to 0.6 μm, more preferably from 0.04 to 0.5 μm, and particularly preferably from 0.05 to 0.45 μm. When the thickness is 0.03 μm or more, good transferring property of a resist pattern to the intermediate layer can be secured and the generation of pinholes of the film can be restrained, and the thickness of 0.6 μm or less contributes to the maintenance of lithographic performances. Here, positive or negative resist suitable for each light source of near ultraviolet rays, KrF, ArF, $F_2$, EUV, EB and X-rays can be used for the upper resist layer.

The obtained three-layer resist is then subjected to pattern forming process. As the first stage, the film of the upper resist layer is subjected to pattern-forming process. Mask adjustment is performed, if necessary, and the upper resist layer is exposed to high-energy rays through the mask. The resist composition of the exposed area is thereby made soluble or insoluble in an alkali aqueous solution, and a pattern is formed by development in an alkali aqueous solution.

In the next place, dry etching of the intermediate layer is performed as the second stage. Dry etching is performed by $CHF_3$ gas plasma etching with the pattern of the film of the resist composition of the upper layer as the mask, thereby a micro pattern is formed. The technique of etching of the intermediate layer by $CHF_3$ gas plasma etching is completely the same as the plasma etching utilized in the etching process of conventional substrates suchasoxide films. The dry etching can be carried out by means of a cylindrical plasma etching apparatus with $CHF_3$ gas or $CF_4$ gas as reactive gas, i.e., etching gas.

Subsequently, dry etching of the lower layer is performed as the third stage. Dry etching is performed by oxygen plasma etching with the pattern of the film of the intermediate layer composition as the mask, thereby a micro pattern having high aspect ratio is formed. The technique of etching of the organic polymer film by oxygen plasma etching is completely the same as the plasma etching utilized in a resist film peeling after ending of etching process of a substrate by conventional photo-etching operation. The dry etching can be carried out by means of a cylindrical plasma etching apparatus with oxygen as reactive gas, i.e., etching gas. Oxygen gas can be used as mixture with sulfurous acid gas.

EXAMPLE

The present invention is described in detail with reference to examples but the invention is not limited thereto.

Synthesis of Polymer (I-35):

(1) Synthesis of Trisilanol

An eggplant type flask having a capacity of 2,000 ml was equipped with a dry ice cooling pipe and a mechanical stirrer, and 10 g of Amber Jet 4200 and 21.6 g of water were put in the flask and Amber Jet 4200 was dissolved by stirring. In the next place, 300 ml of THF (tetrahydrofuran), 300 ml of hexane, 17.8 g (90 mmol) of phenyltrimethoxysilane, and 13.5 g (90 mmol) of ethyltrimethoxysilane were added thereto and stirred at 60° C. for 12 hours. The reaction solution was filtered at room temperature, THF and hexane were distilled from the filtrate, and the filtrate was neutralized with 75 ml of toluene and 50 ml of 1N hydrochloric acid and extracted. The organic phase was washed with water and the organic solvent was distilled off. Trisilanol (10.0 g) was obtained by vacuum drying. It was confirmed from molecular weight analysis by GPC that the trisilanol had a weight average molecular weight of 1,200, and Ph/Et ratio of 1/1 (by NMR analysis).

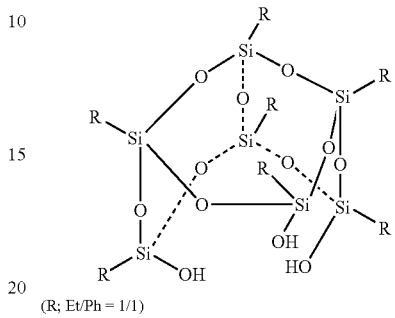

(R; Et/Ph = 1/1)

(2) Synthesis of the Polymer

Trisilanol synthesized in the above step (1) (7.5 g) was introduced into a 1,000 ml eggplant type flask equipped with a Dimroth condenser, a dropping funnel and a stirrer, and the flask was subjected to drying by aeration and nitrogen substitution. Dehydrated THF (300 ml) and 3 ml of triethylamine were added thereto. Further, 1.25 g of 1,5-dichlorohexamethyltrisiloxane was added by the dropping funnel, and the reaction solution was stirred for 12 hours by reflux on heating. Five (5) ml of concentrated hydrochloric acid and 15 ml of water were carefully added to the reaction solution. Thirty (30) ml of toluene was added to the obtained solution to perform extraction, the organic phase was washed with water, the organic solvent was distilled off, and 4.5 g of white polymer was taken out. It was confirmed frommolecular weight analysis by GPC that the polymer had a weight average molecular weight of 5,600.

Polymers (I-1), (I-3), (I-5), (I-6), (I-9) (I-12), (I-15), (I-17), (I-21), (I-23), (I-24), (I-25), (I-26) and (I-36) were synthesized in the same manner as above.

Mw (weight average molecular weight) of each polymer is shown below.

|      | Mw     |
|------|--------|
| I-1  | 6,600  |
| I-3  | 5,800  |
| I-5  | 11,900 |
| I-6  | 13,600 |
| I-9  | 8,100  |
| I-12 | 10,000 |
| I-15 | 10,500 |
| I-17 | 4,800  |
| I-21 | 11,200 |
| I-23 | 9,400  |
| I-24 | 6,300  |
| I-25 | 7,700  |
| I-26 | 6,600  |
| I-35 | 5,600  |
| I-36 | 5,700  |

Examples 1 to 14

(1) Formation of Lower Resist Layer

FHi-028DD resist (manufactured by Fuji Photo Film Olin Co., Ltd.) was coated on a 6 inch silicone wafer with a spin coater Mark 8 (manufactured by Tokyo Electron Limited), the wafer was baked at 90° C. for 90 seconds, thereby a uniform film having a thickness of 0.55 μm was obtained.

The wafer was further subjected to heating at 200° C. for 3 minutes, thus a lower resist layer having a thickness of 0.40 μm was obtained.

(2) Formation of Intermediate Layer

An intermediate layer coating solution having the composition shown in Table 1 below was prepared. The obtained solution was precisely filtered through a membrane filter having a pore diameter of 0.1 μm, thereby an intermediate layer composition was obtained.

The intermediate layer composition was coated on the lower resist layer in the same manner as above, heated at 200° C. for 5 minutes, and an intermediate layer having a thickness of 0.10 μm was obtained.

(3) Formation of Upper Resist Layer

An upper layer coating solution having the composition shown below was prepared. The obtained solution was precisely filtered through a membrane filter having a pore diameter of 0.1 μm, thereby an upper layer resist composition was obtained.

The upper layer resist composition was coated on the intermediate layer in the same manner as above, heated at 120° C. for 90 seconds, and an upper layer resist layer having a thickness of 0.30 μm was obtained.

Upper Layer Resist Solution:

The following acid-decomposable resin (Mw: 16,500): 11.6 g

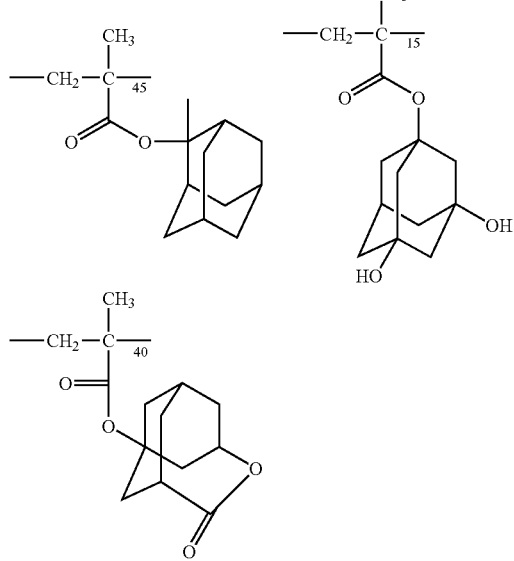

The following acid generator: 0.36 g

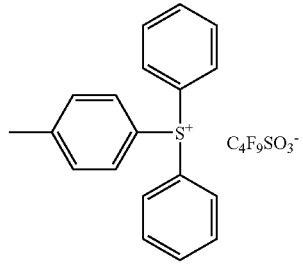

The following basic compound: 0.024 g
1,5-Diazabicyclo[4.3.0]nona-5-ene
The follwing surfactant: 0.01 g
Megafac F-176 (manufactured by Dainippon Ink and Chemicals Inc.)
The following solvent: 88 g
Propylene glycol monomethyl ether acetate
A resolution mask was mounted on ArF Excimer Stepper 9300 (manufactured by ISI Co.) and the above-obtained wafer underwent exposure with varying the exposure amount.

The wafer was subjected to heating at 120° C. for 90 seconds in a clean room, development with a tetrahydroammonium hydroxide developer (2.38 mass %) for 60 seconds, rinsing with distilled water, and drying, thereby a pattern (an upper layer pattern) was obtained. The wafer having the upper layer pattern was subjected to etching (dry development) with a parallel plate type reactive ion etching apparatus DES-245R (manufactured by Plasma System Co.), thus a pattern was formed on the intermediate layer. The etching gas was $CHF_3$, pressure was 30 mTorr, and applied power was 100 mW/cm². The formed pattern was observed with a scanning electron microscope.

The sectional form of the upper layer pattern and the line edge roughness (LER) after etching the intermediate layer with the upper layer pattern as the mask were evaluated by the following methods.

(1) Sectional Form of the Upper Layer Pattern:

After patterning the upper layer resist, the sectional form of the pattern was observed with S-4200 (manufactured by Hitachi Limited).

(2) Line Edge Roughness (LER):

After etching the intermediate layer, the dimensions of the lines of 120 nm (line/space=1/1) at different spots (50 spots) (measuring points: 30 points) in the in-plane of the 6 inch silicone wafer were measured with SEM (S-9200, manufactured by Hitachi Limited). The dispersion of the actually measured value −120 nm was obtained, from which 3σ was computed. The smaller the value, the better is LER.

The preservation stability of the intermediate layer coating solution and the peeling phenomenon of the upper layer was evaluated by the following methods.

(3) Preservation Stability of Intermediate Layer Coating Solution:

The rate of change in the film thickness immediately after preparation of the intermediate layer coating solution and after preservation at 40° C. for one week (acceleration test) was compared under the same coating condition. The rate of change of less than 0.6% was graded o (good), from 0.6 to 1.5% was graded Δ (allowable) and 1.5% or more was graded x (failure).

(4) Peeling Phenomenon of Upper Layer Pattern

After patterning the upper layer resist, the peeling phenomenon of the upper layer was observed (with S-9200, manufactured by Hitachi Limited).

Peeling phenomenon was observed: o

Peeling phenomenon was not observed: x (5) Etching Rate of Intermediate Layer:

The thickness of the intermediate layer after patterning was measured with a scanning electron microscope, and evaluation was performed by the difference with the initial thickness. With the value of the later-described Comparative Example 1 as standard, and the difference in thickness of less than 60% as that of the standard was graded o (good), 60% or more and less than 80% was graded Δ (allowable), and 80% or more was graded x (failure).

The results of evaluations are shown in Table 1 below.

Comparative Example 1

The intermediate layer coating solution used in Comparative Example 1 having the following composition was prepared according to the method disclosed in Japanese Patent 2901044.

Intermediate Layer Coating Solution in Comparative Example 1:

The following polymer (I-X) having Mw of 2,000: 19 g

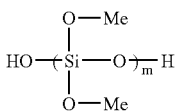

The following acid generator (D-X): 0.825 g

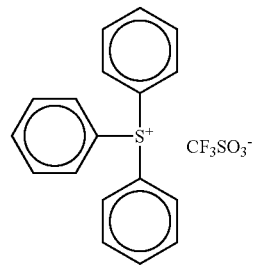

Monochlorobenzene: 178 g

The intermediate layer coating solution in Comparative Example 1 was coated on the lower layer resist in the same manner as in Examples. Evaluation was performed in the same manner as in Examples except that the intermediate layer was exposed to an Xe-Hg lamp for 5 minutes.

Comparative Examples 2 and 3

Each intermediate layer coating solution was formed and evaluated in the same manner as in Examples except that the following I-Y (weight average molecular weight: 7,800) was used as component (A).

TABLE 1

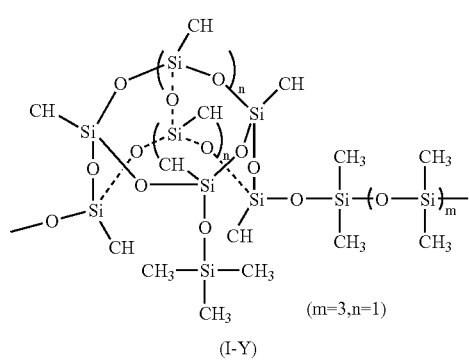

(I-Y)

| Example No. | Component A (amt.: g) | Resin Used in Combination (amt.: g) | Components (amount: g) | | | | | | Preservation Stability of Intermediate Layer Coating Solution (%) | Sectional Form of Upper Layer Resist Pattern | LER after Intermediate Layer Etching (nm) | Pattern Peeling of Upper Layer Resist | Etching Rate of Intermediate Layer |
|---|---|---|---|---|---|---|---|---|---|---|---|---|---|
| | | | B | C | D | E | F | G | | | | | |
| 1 | I-1 (1.1) | — | — | — | — | — | F-1 (1.9) | — | ○ | Rectangular | 3 | ○ | ○ |
| 2 | I-3 (1.1) | — | — | — | — | — | F-1 (1.9) | — | ○ | Rectangular | 4 | ○ | ○ |
| 3 | I-5 (1.1) | — | — | — | — | — | F-1 (1.9) | — | ○ | Rectangular | 5 | ○ | ○ |
| 4 | I-6 (1.1) | — | — | — | — | — | F-1 (1.9) | — | ○ | Rectangular | 4 | ○ | ○ |

TABLE 1-continued

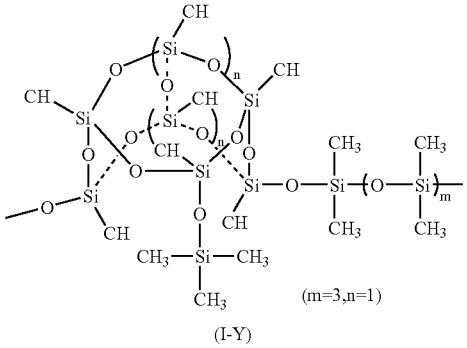

(I-Y)

(m=3, n=1)

(I-Y)

| Example No. | Component A (amt.: g) | Resin Used in Combination (amt.: g) | B | C | D | E | F | G | Preservation Stability of Intermediate Layer Coating Solution (%) | Sectional Form of Upper Layer Resist Pattern | LER after Intermediate Layer Etching (nm) | Pattern Peeling of Upper Layer Resist | Etching Rate of Intermediate Layer |
|---|---|---|---|---|---|---|---|---|---|---|---|---|---|
| 5 | I-9 (1.1) | — | — | — | — | — | F-1 (1.9) | — | ○ | Rectangular | 3 | ○ | ○ |
| 6 | I-12 (1.1) | — | — | — | — | — | F-1 (1.9) | — | ○ | Rectangular | 5 | ○ | ○ |
| 7 | I-15 (1.1) | — | — | — | — | — | F-1 (1.9) | — | ○ | Rectangular | 4 | ○ | ○ |
| 8 | I-17 (1.1) | — | — | — | — | — | F-1 (1.9) | — | ○ | Rectangular | 3 | ○ | ○ |
| 9 | I-21 (1.1) | — | — | — | — | — | F-1 (1.9) | — | ○ | Rectangular | 2 | ○ | ○ |
| 10 | I-23 (1.1) | — | — | — | — | — | F-1 (1.9) | — | ○ | Rectangular | 3 | ○ | ○ |
| 11 | I-24 (1.1) | — | — | — | — | — | F-1 (1.9) | — | ○ | Rectangular | 4 | ○ | ○ |
| 12 | I-25 (1.1) | — | — | — | — | — | F-1 (1.9) | — | ○ | Rectangular | 5 | ○ | ○ |
| 13 | I-26 (1.1) | — | — | — | — | — | F-1 (1.9) | — | ○ | Rectangular | 3 | ○ | ○ |
| 14 | I-35 (1.1) | — | — | — | — | — | F-1 (1.9) | — | ○ | Rectangular | 3 | ○ | ○ |
| 15 | I-36 (1.1) | — | — | — | — | — | F-1 (1.9) | — | ○ | Rectangular | 3 | ○ | ○ |
| 16 | I-1 (1.1) | PHS (0.3) | — | — | — | — | F-1 (1.9) | — | ○ | Rectangular | 4 | ○ | Δ |
| 17 | I-1 (1.1) | PHS (0.3) | — | — | D-1 (0.05) | — | F-1 (1.9) | — | Δ | Rectangular | 3 | ○ | Δ |
| 18 | I-1 (1.1) | NVK (0.3) | — | C-1 (0.1) | D-2 (0.05) | — | F-2 (1.9) | — | Δ | Rectangular | 2 | ○ | Δ |
| 19 | I-1 (1.1) | — | B-1 (0.05) | — | — | E-1 (0.3) | F-3 (1.9) | — | Δ | Rectangular | 2 | ○ | Δ |
| 20 | I-1 (1.1) | PHS (0.3) | — | — | — | — | F-4 (1.9) | G-1 (0.006) | ○ | Rectangular | 3 | ○ | Δ |
| 21 | I-1 (1.1) | PHS (0.3) | — | — | D-3 (0.05) | — | F-5 (1.9) | G-1 (0.006) | Δ | Rectangular | 4 | ○ | Δ |
| 22 | I-1 (1.1) | NVK (0.3) | — | C-1 (0.1) | D-4 (0.05) | — | F-1 (1.9) | G-1 (0.006) | Δ | Rectangular | 2 | ○ | Δ |
| 23 | I-1 (1.1) | — | B-1 (0.05) | — | — | E-1 (0.3) | F-1 (1.9) | G-1 (0.006) | Δ | Rectangular | 2 | ○ | Δ |
| Comp. Ex1 | I-X (1.1) | — | — | — | D-X (0.825) | — | F-6 (178) | — | X | Trapezoidal | 30 | ○ | Δ |
| Comp. Ex2 | I-Y (1.1) | — | — | — | — | — | F-1 (1.9) | — | ○ | Pattern could not be formed. | — | — | — |
| Comp. Ex3 | I-Y (0.7) | PHS (0.3) | — | — | D-1 (0.05) | — | F-1 (1.9) | G-1 (0.006) | Δ | Rectangular | 7 | ○ | X (std.) |

The resins used in combination other than component (A), and component (B), component (C), component (D), component (E), component (F) and component (G) are shown below.

Resins used in combination other than component (A):
  PHS (poly-p-hydroxystyrene, Mw: 8,000)
  NVK (m/p-creson (6/4) novolak resin, Mw: 6,700)
B-1: 2,2-Azobis(2-methylpropane) (VR-160, manufactured by Wako Pure Chemical Co., Ltd.)
C-1: Tetramethoxymethyl glycol lauryl (Nicaluck N-270, manufactured by SANWA CHEMICAL CO., LTD.)
E-1: Pentaerythritol tetraacrylate

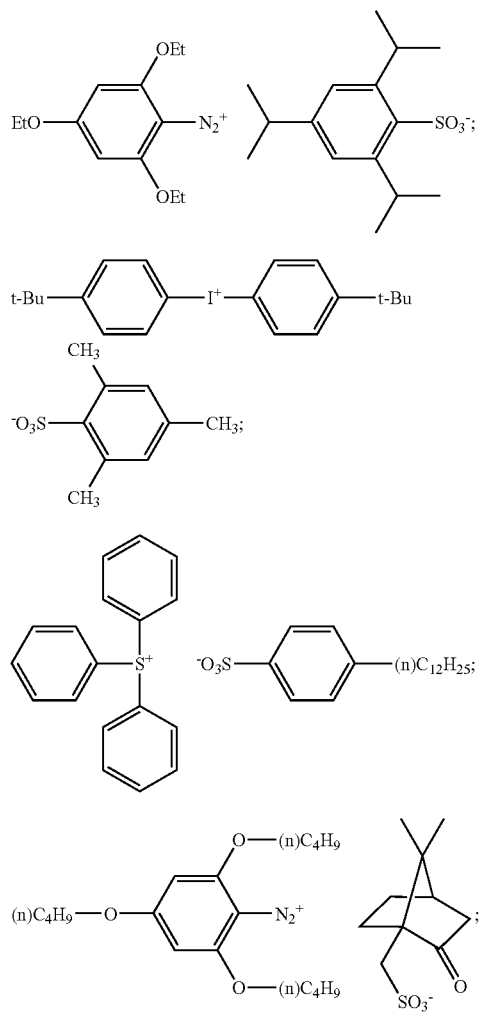

F-1: Propylene glycol monomethyl ether acetate
F-2: 2-Heptanone
F-3: Cyclohexanone
F-4: Methyl methoxypropionate
F-5: Butyl acetate
F-6: Monochlorobenzene-1, Megafac R08 (manufactured by Dainippon Ink and Chemicals Inc.)

The following things are apparent from the results of evaluations of the samples in Examples 1 to 23 and Comparative Examples 1 to 3.

That is, by the intermediate layer compositions for multilayer resist process according to the present invention and the pattern-forming process using these compositions, the present invention is superior to comparative examples in the preservation stability of the intermediate layer coating solution, so that the present invention can exhibit excellent performances in the sectional form of the upper layer resist pattern, LER after etching of the intermediate layer, pattern peeling of the upper layer and etching rate.

The present invention provides an intermediate layer composition for multilayer resist process which is soluble in an organic solvent, excellent in preservation stability, not forming a trapezoidal form in patterning, excellent in line edge roughness, peeling resistance of an upper layer resist pattern, and improved in etching rate, and provides a pattern forming process.

The entire disclosure of each and every foreign patent application from which the benefit of foreign priority has been claimed in the present application is incorporated herein by reference, as if fully set forth.

What is claimed is:

1. An intermediate layer composition for multilayer resist process, the composition comprising polymer (A) having a repeating unit represented by the following formula (I):

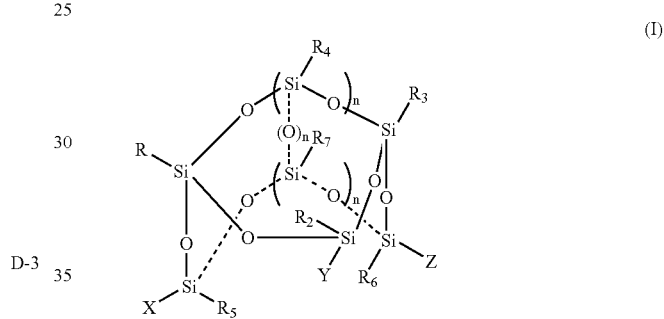

wherein $R_1$ to $R_7$ are the same or different, and each represents a hydrogen atom, an alkyl group, an alkoxyl group, an aryl group, an aralkyl group, a cycloalkyl group or an alkenyl group; one of X, Y and Z represents a hydroxyl group, and the another one of X, Y and Z is —O—, and the other one of X, Y and Z is a group represented by following formula (IA) which is linked on the oxygen atom side; and n represents from 0 to 10;

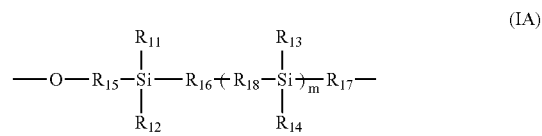

wherein $R_{11}$ to $R_{14}$ are the same or different, and each represents a hydrogen atom, an alkyl group, an alkoxyl group, an aryl group, an aralkyl group, a cycloalkyl group or an alkenyl group;

$R_{15}$ to $R_{17}$ are the same or different, and each represents a single bond or an alkylene group;

$R_{18}$ represents a single bond or —O—; and m represents from 0 to 10.

2. The intermediate layer composition according to claim 1, further comprising: (B) a radical generator.

3. The intermediate layer composition according to claim 1, further comprising: (C) a crosslinking agent.

4. The intermediate layer composition according to claim 1, further comprising: (D) a compound that generates an acid by heating.

5. The intermediate layer composition according to claim 1, further comprising: (E) a radical polymerizable compound.

6. The intermediate layer composition according to claim 1, further comprising: (F) an organic solvent.

7. The intermediate layer composition according to claim 1, further comprising: (G) a surfactant.

8. A multilayer resist pattern-forming process comprising:

(a) forming a lower resist layer comprising an organic material on a substrate;

(b) laminating on the lower resist layer an intermediate layer and an upper resist layer comprising an organic material crosslinkable or decomposable upon irradiation with radiation; and (c) forming a prescribed pattern on the upper resist layer, and then etching the intermediate layer, the lower layer and the substrate successively, wherein the intermediate layer composition according to claim 1 is used in the intermediate layer.

9. The multilayer resist pattern-forming process according to claim 8, wherein after coating the intermediate layer composition on the lower resist, the intermediate layer is insolubilized in an organic solvent by being baked.

10. A laminate comprising: a substrate, a lower resist layer comprising an organic material, an intermediate layer and an upper resist layer comprising an organic material crosslinkable or decomposable upon irradiation with radiation, in this order, wherein the intermediate layer comprises polymer (A) having a repeating unit represented by the following formula (I):

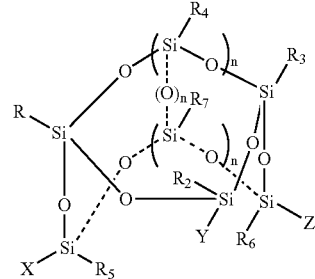
(I)

wherein $R_1$ to $R_7$ are the same or different, and each represents a hydrogen atom, an alkyl group, an alkoxyl group, an aryl group, an aralkyl group, a cycloalkyl group or an alkenyl group; one of X, Y and Z represents a hydroxyl group, and the another one of X, Y and Z is -O-, and the other one of X, Y and Z is a group represented by following formula (IA) which is linked on the oxygen atom side; and n represents from 0 to 10;

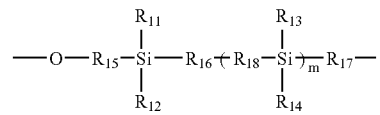
(IA)

wherein $R_{11}$ to $R_{14}$ are the same or different, and each represents a hydrogen atom, an alkyl group, an alkoxyl group, an aryl group, an aralkyl group, a cycloalkyl group or an alkenyl group;

$R_{15}$ to $R_{17}$ are the same or different, and each represents a single bond or an alkylene group;

$R_{18}$ represents a single bond or —O—; and m represents from 0 to 10.

* * * * *